(12) United States Patent
Lee

(10) Patent No.: US 10,250,789 B2
(45) Date of Patent: Apr. 2, 2019

(54) ELECTRONIC DEVICE WITH MODULATED LIGHT FLASH OPERATION FOR ROLLING SHUTTER IMAGE SENSOR

(71) Applicant: Google Inc., Mountain View, CA (US)

(72) Inventor: Johnny C Lee, Mountain View, CA (US)

(73) Assignee: GOOGLE LLC, Mountain View, CA (US)

( * ) Notice: Subject to any disclaimer, the term of this patent is extended or adjusted under 35 U.S.C. 154(b) by 26 days.

(21) Appl. No.: 15/426,675

(22) Filed: Feb. 7, 2017

(65) Prior Publication Data

US 2017/0150021 A1 May 25, 2017

Related U.S. Application Data

(62) Division of application No. 14/086,427, filed on Nov. 21, 2013, now abandoned.
(Continued)

(51) Int. Cl.
*G03B 9/08* (2006.01)
*G06F 1/16* (2006.01)
(Continued)

(52) U.S. Cl.
CPC ............. *H04N 5/2256* (2013.01); *G03B 9/08* (2013.01); *G06F 1/1686* (2013.01); *G06F 3/011* (2013.01);
(Continued)

(58) Field of Classification Search
None
See application file for complete search history.

(56) References Cited

U.S. PATENT DOCUMENTS 6,243,537 B1 6/2001 Higashino
9,398,287 B2 7/2016 Lee
(Continued)

OTHER PUBLICATIONS

Notice of Allowance dated Mar. 2, 2018 for U.S. Appl. No. 15/182,963, 19 pages.
(Continued)

*Primary Examiner* — Twyler L Haskins
*Assistant Examiner* — Quan Pham

(57) ABSTRACT

An electronic device (100) includes a modulated light projector (119) and an electronic rolling shutter (ERS) imaging camera (1302) having a sensor array (1306) with a set of pixel rows. The electronic device includes a controller (1304) to control the modulated light projector (119) to project a modulated light flash (1608, 1810, 2010) during capture of a first image frame (1606, 1806, 2006) by the sensor array. The controller is to initiate the modulated light flash while each pixel row of the set is exposed for gathering light and to terminate the modulated light flash before a pixel row of the set is exposed for capture of a next image frame by the sensor array. The electronic device further includes a processor (802) to determine modulated light image data (1320) based on the first image frame. The controller also may control the modulated light projector to refrain from projecting the modulated light flash during capture of a second image frame (1602, 1612, 1802, 1816, 2002, 2018), adjacent to the first image frame.

15 Claims, 18 Drawing Sheets

Related U.S. Application Data

(60) Provisional application No. 61/841,725, filed on Jul. 1, 2013.

(51) Int. Cl.

| | | |
|---|---|---|
| *G06F 3/01* | (2006.01) | |
| *G06F 3/03* | (2006.01) | |
| *G06K 9/22* | (2006.01) | |
| *G06K 9/46* | (2006.01) | |
| *G06T 7/80* | (2017.01) | |
| *H01S 5/00* | (2006.01) | |
| *H01S 5/42* | (2006.01) | |
| *H04N 5/33* | (2006.01) | |
| *G02B 27/42* | (2006.01) | |
| *H04N 13/00* | (2018.01) | |
| *H04N 5/225* | (2006.01) | |
| *H04N 5/232* | (2006.01) | |
| *H04N 5/235* | (2006.01) | |
| *H04N 5/353* | (2011.01) | |
| *H04N 13/239* | (2018.01) | |
| *H04N 13/271* | (2018.01) | |

(52) U.S. Cl.
CPC ............ *G06F 3/0304* (2013.01); *G06K 9/22* (2013.01); *G06K 9/4661* (2013.01); *G06T 7/80* (2017.01); *H04N 5/2258* (2013.01); *H04N 5/2353* (2013.01); *H04N 5/2354* (2013.01); *H04N 5/23245* (2013.01); *H04N 5/23293* (2013.01); *H04N 5/353* (2013.01); *H04N 5/3532* (2013.01); *H04N 13/271* (2018.05); *G02B 27/425* (2013.01); *G06T 2207/20224* (2013.01); *G06T 2207/30244* (2013.01); *G09G 2320/103* (2013.01); *G09G 2360/144* (2013.01); *H01S 5/0071* (2013.01); *H01S 5/423* (2013.01); *H04N 5/33* (2013.01); *H04N 13/239* (2018.05); *H04N 2013/0081* (2013.01)

(56) References Cited

U.S. PATENT DOCUMENTS

| | | |
|---|---|---|
| 2003/0001956 A1 | 1/2003 | Harshbarger, Jr. |
| 2003/0197806 A1* | 10/2003 | Perry ................ H04N 13/0207 348/370 |
| 2008/0024655 A1* | 1/2008 | Maeda ................ H04N 5/2354 348/371 |
| 2008/0149810 A1 | 6/2008 | Tracy |
| 2009/0322745 A1* | 12/2009 | Zhang .................... G06T 7/521 345/420 |
| 2010/0194963 A1 | 8/2010 | Terashima |
| 2010/0295963 A1 | 11/2010 | Shintani |
| 2011/0187878 A1* | 8/2011 | Mor .................... G02B 27/0983 348/218.1 |
| 2012/0194644 A1 | 8/2012 | Newcombe |
| 2012/0262553 A1 | 10/2012 | Chen |
| 2013/0155275 A1* | 6/2013 | Shimizu ............... H04N 5/2256 348/223.1 |
| 2014/0206443 A1* | 7/2014 | Sharp ................... G06T 7/0075 463/31 |
| 2014/0240464 A1 | 8/2014 | Lee |

OTHER PUBLICATIONS

Non-Final Office Action dated Aug. 10, 2017 for U.S. Appl. No. 15/182,963, 57 pages.

Translation of Office Action dated May 17, 2017 for Chinese Application No. 2014800110495, 7 pages.

* cited by examiner

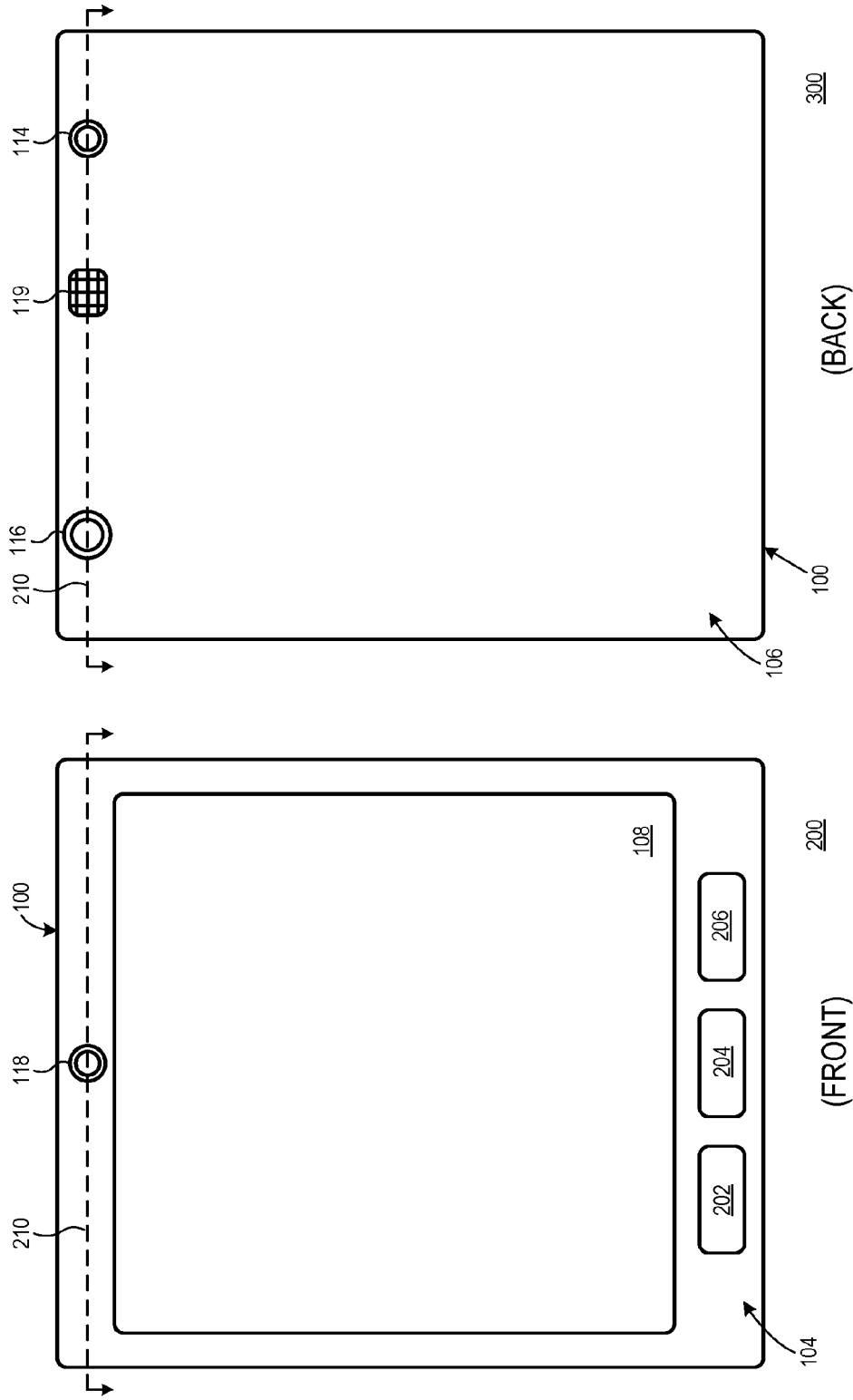

ELECTRONIC DEVICE WITH MODULATED LIGHT FLASH OPERATION FOR ROLLING SHUTTER IMAGE SENSOR

FIELD OF THE DISCLOSURE

The present disclosure relates generally to image capture devices and more particularly to image capture devices with rolling shutter imaging cameras.

BACKGROUND

Machine-vision-enabled devices may employ depth sensors to determine the depth, or relative distance, of objects within a local environment. Typically, these depth sensors rely on the capture of reflections of known spatially-modulated or temporally-modulated light projected at the object by the device. This modulated light often is implemented as infrared (IR) light generated by an IR light source. While effective at enabling depth estimation, the reflected IR light can interfere with visible-light imaging cameras operating in the local environment. The interference caused by modulated light flashes is particularly pernicious when utilizing electronic rolling shutter (ERS) imaging cameras because conventional flash timing typically results in the flash occurring while the top rows of the ERS imaging camera are capturing light for one image frame while the bottom rows of the ERS imaging camera are capturing light for the previous image frame. As such, a single modulated light flash in a conventional ERS imaging camera configuration can interfere with the capture of two adjacent image frames.

BRIEF DESCRIPTION OF THE DRAWINGS

The present disclosure may be better understood by, and its numerous features and advantages made apparent to, those skilled in the art by referencing the accompanying drawings. The use of the same reference symbols in different drawings indicates similar or identical items.

FIG. 2 is a diagram illustrating a front plan view of an electronic device implementing multiple imaging cameras and a depth sensor in accordance with at least one embodiment of the present disclosure.

FIG. 3 is a diagram illustrating a back plan view of the electronic device of FIG. 2 in accordance with at least one embodiment of the present disclosure.

DETAILED DESCRIPTION

Figure 1:
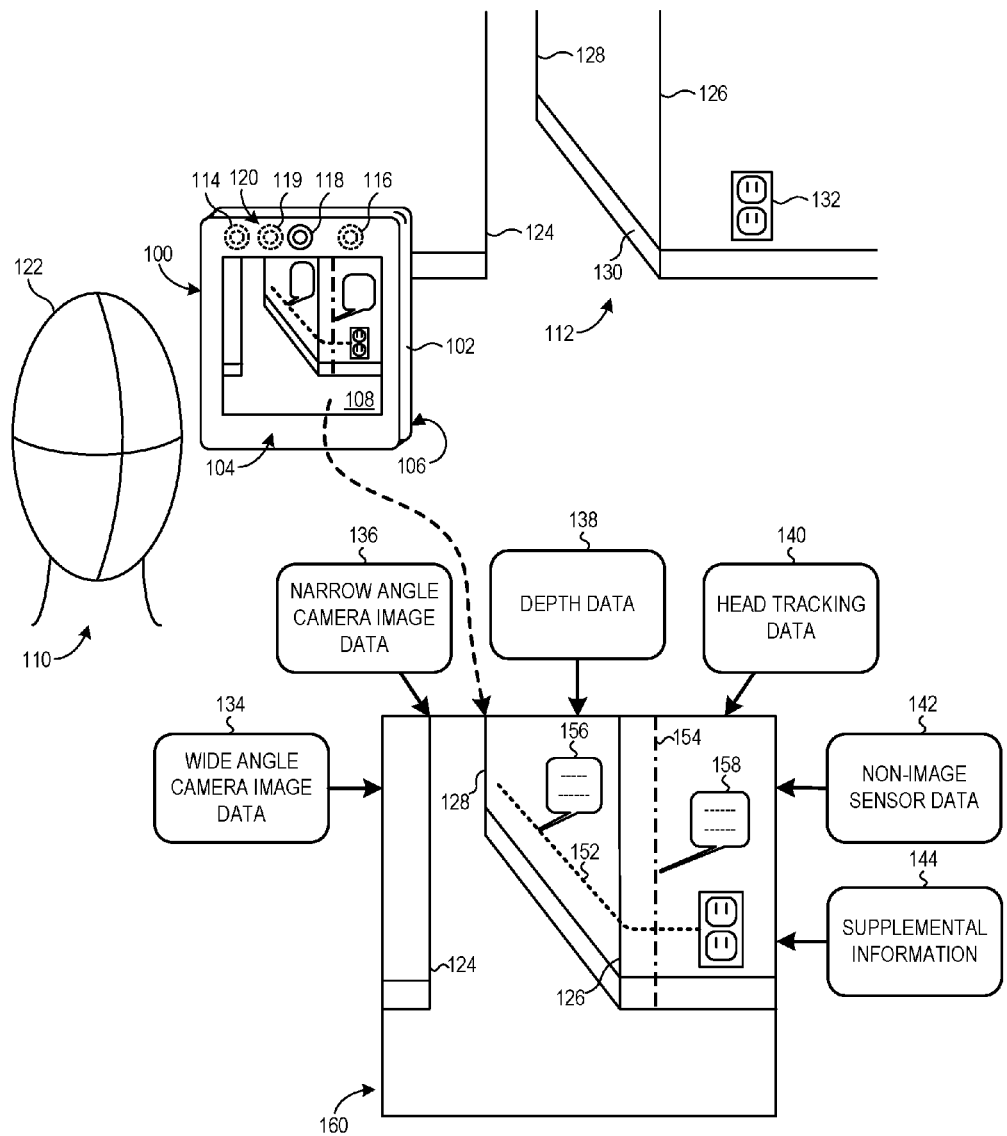
FIG. 1 is a diagram illustrating an electronic device configured to determine a relative position/orientation in a local environment using image sensor data and non-image sensor data in accordance with at least one embodiment of the present disclosure.

The following description is intended to convey a thorough understanding of the present disclosure by providing a number of specific embodiments and details involving the determination of a relative position or relative orientation of an electronic device based on image-based identification of objects in a local environment of the electronic device. It is understood, however, that the present disclosure is not limited to these specific embodiments and details, which are examples only, and the scope of the disclosure is accordingly intended to be limited only by the following claims and equivalents thereof. It is further understood that one possessing ordinary skill in the art, in light of known systems and methods, would appreciate the use of the disclosure for its intended purposes and benefits in any number of alternative embodiments, depending upon specific design and other needs.

FIGS. 1-20 illustrate various techniques for the determination of a relative position or relative orientation of an electronic device within a local environment so as to support location-based functionality, such as augmented reality (AR) functionality, visual odometry or other simultaneous localization and mapping (SLAM) functionality, and the like. The term "position/orientation" is used herein to refer to either or both of position and orientation. In some embodiments, the electronic device includes two or more imaging cameras and a depth sensor disposed at a surface. The two or more imaging cameras may be used to capture multiview imagery of the local environment of the electronic device, and from this information the electronic device may identify spatial features representing objects in the local environment and their distances from the electronic device. Further, the depth sensor may be used to determine the distances of the identified spatial features as either an alternative to, or an augmentation to, the depth calculation provided from analysis of the multiview imagery. The electronic device further may include another imaging camera on a surface facing the user so as to facilitate head tracking or facial recognition or to obtain additional imagery of the local environment.

The identification of the relative position/orientation of objects in the local environment can be used to support various location-based functionality of the electronic device. To illustrate, in some embodiments, the relative positions of objects in the local environment are used, along with non-image sensor data such as orientation readings from a gyroscope, to determine the relative position/orientation of the electronic device in the local environment. The relative position/orientation of the electronic device may be used to facilitate visual odometry, indoor navigation, or other SLAM functionality. Moreover, the relative position/orientation of the electronic device may be used to support augmented reality (AR) functionality, such as the graphical overlay of additional information in the display of imagery captured by the electronic device based on the relative position and orientation of the electronic device, and which also may be based on the position or the orientation of the user's head or eyes relative to the electronic device. In some embodiments, the electronic device determines its position/orientation relative to the local environment, rather than relative to a fixed or defined positioning reference, and thus is not reliant on external positioning information, such as global positioning system (GPS) information, cellular triangulation information, and the like. As such, the electronic device can provide location-based functionality in locations where GPS signaling or cellular signaling is weak or non-existent.

In at least one embodiment, the depth sensor of the electronic device is implemented as a modulated light projector and one or more of the imaging cameras. The modulated light projector projects coded, structured, or otherwise modulated light, typically infrared light, into the local environment, and the one or more imaging cameras capture the reflections of the modulated light from the objects, and from this reflected light the distance of the objects from the electronic device may be determined. As the modulated light projector can consume significant power while projecting, the present disclosure describes various techniques for the selective enablement and control of the depth sensor so as to reduce power consumption. Moreover, as the projection of modulated light, or "modulated light flash," can interfere with the capture of non-depth imagery by the imaging cameras, particularly for implementations using an electronic rolling shutter (ERS) imaging camera, the present disclosure also describes various techniques for reducing such interference during a depth sensing process using reflected modulated light projections.

Further described herein is a processing architecture for analyzing image sensor data and non-image sensor data to efficiently identify 2D and 3D spatial features in imagery of the local environment of the electronic device, and for providing location-based functionality using these identified spatial features. In at least one embodiment, the processing architecture utilizes at least two processors, including one processor for identifying 2D spatial features from image data captured by one or more imaging cameras and another processor for identifying 3D spatial features from the identified 2D spatial features. Further, the processor that identifies the 2D spatial features can be configured to identify 2D spatial features as image data is streamed from the imaging cameras and stream the 2D spatial features to the other processor as they are identified, thereby reducing the delay in spatial feature detection that otherwise would result from waiting for the entire image frame to be buffered before commencing spatial feature detection.

FIG. 1 illustrates an electronic device 100 configured to support location-based functionality, such as SLAM or AR, using image and non-image sensor data in accordance with at least one embodiment of the present disclosure. The electronic device 100 can include a portable user device, such as a tablet computer, computing-enabled cellular phone (e.g., a "smartphone"), a notebook computer, a personal digital assistant (PDA), a gaming system remote, a television remote, and the like. In other embodiments, the electronic device 100 can include a fixture device, such as medical imaging equipment, a security imaging camera system, an industrial robot control system, a drone control system, and the like. For ease of illustration, the electronic device 100 is generally described herein in the example context of a portable user device, such as a tablet computer or a smartphone; however, the electronic device 100 is not limited to these example implementations.

In the depicted example, the electronic device 100 includes a housing 102 having a surface 104 opposite another surface 106. In the example thin rectangular block form-factor depicted, the surfaces 104 and 106 are substantially parallel and the housing 102 further includes four side surfaces (top, bottom, left, and right) between the surface 104 and surface 106. The housing 102 may be implemented in many other form factors, and the surfaces 104 and 106 may have a non-parallel orientation. For the illustrated tablet implementation, the electronic device 100 includes a display 108 disposed at the surface 106 for presenting visual information to a user 110. Accordingly, for ease of reference, the surface 106 is referred to herein as the "forward-facing" surface and the surface 104 is referred to herein as the "user-facing" surface as a reflection of this example orientation of the electronic device 100 relative to the user 110, although the orientation of these surfaces is not limited by these relational designations.

The electronic device 100 includes a plurality of sensors to obtain information regarding a local environment 112 of the electronic device 100. The electronic device 100 obtains visual information (imagery) for the local environment 112 via imaging cameras 114 and 116 and a depth sensor 120 disposed at the forward-facing surface 106 and an imaging camera 118 disposed at the user-facing surface 104. In one embodiment, the imaging camera 114 is implemented as a wide-angle imaging camera having a fish-eye lens or other wide-angle lens to provide a wider angle view of the local environment 112 facing the surface 106. The imaging camera 116 is implemented as a narrow-angle imaging camera having a typical angle of view lens to provide a narrower angle view of the local environment 112 facing the surface 106. Accordingly, the imaging camera 114 and the imaging camera 116 are also referred to herein as the "wide-angle imaging camera 114" and the "narrow-angle imaging camera 116," respectively. As described in greater detail below, the wide-angle imaging camera 114 and the narrow-angle imaging camera 116 can be positioned and oriented on the forward-facing surface 106 such that their fields of view overlap starting at a specified distance from the electronic device 100, thereby enabling depth sensing of objects in the local environment 112 that are positioned in the region of overlapping fields of view via multiview image analysis. The imaging camera 118 can be used to capture image data for the local environment 112 facing the surface 104. Further, in some embodiments, the imaging camera 118 is configured for tracking the movements of the head 122 or for facial recognition, and thus providing head tracking information that may be used to adjust a view perspective of imagery presented via the display 108.

One or more of the imaging cameras 114, 116, and 118 may serve other imaging functions for the electronic device 100 in addition to supporting position and orientation detection. To illustrate, the narrow-angler imaging camera 116 may be configured or optimized for user-initiated image capture, such as for the capture of consumer-level photographs and video as often found in smartphones and tablet computers, and the imaging camera 118 may be configured or optimized for video conferencing or video telephony as also is often found in smartphones and tablet computers, whereas the wide-angle imaging camera 114 may be primarily configured for machine vision image capture for purposes of location detection. This machine-vision-specific configuration may prioritize light-sensitivity, lens distortion, frame rate, global shutter capabilities, and faster data readout from the image sensor over user-centric camera configurations that focus on, for example, pixel resolution.

The depth sensor 120, in one embodiment, uses a modulated light projector 119 to project modulated light patterns from the forward-facing surface 106 into the local environment, and uses one or both of imaging cameras 114 and 116 to capture reflections of the modulated light patterns as they reflect back from objects in the local environment 112. These modulated light patterns can be either spatially-modulated light patterns or temporally-modulated light patterns. The projection of a modulated light pattern is referred to herein as a "modulated light flash" and the captured reflections of a modulated light flash are referred to herein as "depth images" or "depth imagery." The depth sensor 120 then may calculate the depths of the objects, that is, the distances of the objects from the electronic device 100, based on the analysis of the depth imagery. The resulting depth data obtained from the depth sensor 120 may be used to calibrate or otherwise augment depth information obtained from multiview analysis (e.g., stereoscopic analysis) of the image data captured by the imaging cameras 114 and 116. Alternatively, the depth data from the depth sensor 120 may be used in place of depth information obtained from multiview analysis. To illustrate, multiview analysis typically is more suited for bright lighting conditions and when the objects are relatively distant, whereas modulated light-based depth sensing is better suited for lower light conditions or when the observed objects are relatively close (e.g., within 4-5 meters). Thus, when the electronic device 100 senses that it is outdoors or otherwise in relatively good lighting conditions, the electronic device 100 may elect to use multiview analysis to determine object depths. Conversely, when the electronic device 100 senses that it is indoors or otherwise in relatively poor lighting conditions, the electronic device 100 may switch to using modulated light-based depth sensing via the depth sensor 120.

The electronic device 100 also may rely on non-image information for position/orientation detection. This non-image information can be obtained by the electronic device 100 via one or more non-image sensors (not shown in FIG. 1), such as a gyroscope or ambient light sensor. The non-image sensors also can include user interface components, such as a keypad (e.g., touchscreen or keyboard), microphone, mouse, and the like. The non-image sensor information representing a state of the electronic device 100 at a given point in time is referred to as the "current context" of the electronic device for that point in time. This current context can include explicit context, such as the relative rotational orientation of the electronic device 100 or the ambient light from the local environment 112 incident on the electronic device 100. The current context also can include implicit context information, such as information inferred from calendar information or clock information, or information inferred from a user's interactions with the electronic device 100. The user's interactions can include a user's observed past behavior (e.g., a determination of a user's workday commute path and time), recent search queries conducted by the user, a key term search or other analysis of emails, text messages, or other user communications or user-initiated operations, and the like.

In operation, the electronic device 100 uses the image sensor data and the non-image sensor data to determine a relative position/orientation of the electronic device 100, that is, a position/orientation relative to the local environment 112. In at least one embodiment, the determination of the relative position/orientation is based on the detection of spatial features in image data captured by one or more of the imaging cameras 114, 116, and 118 and the determination of the position/orientation of the electronic device 100 relative to the detected spatial features. To illustrate, in the depicted example of FIG. 1 the local environment 112 includes a hallway of an office building that includes three corners 124, 126, and 128, a baseboard 130, and an electrical outlet 132. The user 110 has positioned and oriented the electronic device 100 so that the forward-facing imaging cameras 114 and 116 capture wide angle imaging camera image data 134 and narrow angle imaging camera image data 136, respectively, that includes these spatial features of the hallway. In this example, the depth sensor 120 also captures depth data 138 that reflects the relative distances of these spatial features relative to the current position/orientation of the electronic device 100. Further, the user-facing imaging camera 118 captures image data representing head tracking data 140 for the current position/orientation of the head 122 of the user 110. Non-image sensor data 142, such as readings from a gyroscope, a magnetometer, an ambient light sensor, a keypad, a microphone, and the like, also is collected by the electronic device 100 in its current position/orientation.

From this input data, the electronic device 100 can determine its relative position/orientation without explicit absolute localization information from an external source. To illustrate, the electronic device 100 can perform multiview analysis of the wide angle imaging camera image data 134 and the narrow angle imaging camera image data 136 to determine the distances between the electronic device 100 and the corners 124, 126, 128. Alternatively, the depth data 138 obtained from the depth sensor 120 can be used to determine the distances of the spatial features. From these distances the electronic device 100 can triangulate or otherwise infer its relative position in the office represented by the local environment 112. As another example, the electronic device 100 can identify spatial features present in one set of captured image frames of the image data 134 and 136, determine the initial distances to these spatial features, and then track the changes in position and distances of these spatial features in subsequent captured imagery to determine the change in position/orientation of the electronic device 100. In this approach, certain non-image sensor data, such as gyroscopic data or accelerometer data, can be used to correlate spatial features observed in one image frame with spatial features observed in a subsequent image frame.

The relative position/orientation information obtained by the electronic device 100 from the image data captured by the imaging cameras 114, 116, and 118 can be used to support any of a variety of location-based functionality. The relative position/orientation information can be used by the electronic device 100 to support visual odometry or other SLAM functionality. As an example, the electronic device 100 can map the local environment 112 and then use this mapping to facilitate the user's navigation through the local environment 112, such as by displaying to the user a floor plan generated from the mapping information and an indicator of the user's current location relative to the floor plan as determined from the current relative position of the electronic device 100.

Moreover, the relative position/orientation information obtained by the electronic device 100 can be combined with supplemental information 144 to present an augmented reality (AR) view of the local environment 112 to the user 110 via the display 108 of the electronic device 100. This supplemental information 144 can include one or more AR databases locally stored at the electronic device 100 or remotely accessible by the electronic device 100 via a wired or wireless network.

To illustrate, in the depicted example of FIG. 1, a local database stores position/orientation computer-aided drawing (CAD) information for electrical wiring embedded within the walls of the office represented by the local environment 112. Accordingly, the electronic device 100 can capture video imagery of a view of the local environment 112 via the imaging camera 116, determine a relative orientation/position of the electronic device 100 as described above and herein, and determine the position and orientation of electrical wiring located within the walls present in the view of the local environment. The electronic device 100 then can generate a graphical overlay with visual representations of the electrical wiring positioned and oriented relative to corresponding spatial features (e.g., the corners 124, 126, and 128) identified in the video imagery. As illustrated in FIG. 1, the graphical overlay can include colored dashed lines 152 and 154 representing electrical wiring in the current view and description balloons 156 and 158 to provide descriptions of the electrical wiring, such as wiring type, an identifier associated with the wiring, and the building components powered by the corresponding wiring. The electronic device 100 then jointly presents the graphical overlay and the video imagery at the display 108 so as to present the user 110 with a graphical representation 160 of the location of electrical wiring within the current view of the local environment 112 as captured by the narrow angle imaging camera 116. As the electronic device 100 moves relative to the previous view, the electronic device 100 updates the graphical overlay so as to reflect the changed perspective. Moreover, the head tracking data 140 can be used to detect changes in the position of the head 122 of the user 110 relative to the display 108, in response to which the electronic device 100 can adjust the displayed graphical representation 160 so as to reflect the changed viewing angle of the user 110 relative to the display 108.

As another example, a local or remote AR database can be used to facilitate indoor navigation via the electronic device 100. To illustrate, the local environment 112 could represent the interior of a shopping mall and, in response to receiving user input indicating a desire to locate a certain store, the electronic device 100 can access the AR database to determine the location of the store relative to its current location. With this information, the electronic device 100 can display on top of the video imagery currently captured by one or more of the imaging cameras 114, 116, or 118 a graphical overlay that identifies the direction of the store relative to the current direction in which the electronic device 100 is pointed (e.g., via the display of "turn right", "turn left", "proceed straight ahead", or "turn around" arrow graphics).

Another example application of the relative position/orientation determination process can include, for example, missing/new object detection whereby the appearance of a new object or the disappearance of a previously identified object can be determined based on a comparison of the expected local environment view of the electronic device 100 for a given relative position and orientation to the actual local environment view captured by the electronic device 100 in the same position/orientation. As described below, the geometric uncertainty introduced by differences between an expected environment and the actual encountered environment can trigger various operations, including a refresh operation whereby the electronic device 100 initiates a remapping of the portion of the local environment 112 exhibiting the change.

FIGS. 2 and 3 illustrate example front and back plan views of an example implementation of the electronic device 100 in a tablet form factor in accordance with at least one embodiment of the present disclosure. The electronic device 100 may be implemented in other form factors, such as a smart phone form factor, a medical imaging device form factor, and the like, which implement configurations analogous to those illustrated.

As illustrated by the front plan view 200 of FIG. 2, the electronic device 100 can include the display 108, the imaging camera 118, and one or more user interface components, such as touch keys 202, 204, and 206 of a keypad disposed at the user-facing surface 104. Moreover, the display 108 may be implemented as a touch screen display so as to facilitate user input and control via the user's interaction with the display 108.

As illustrated by the back plan view 300 of FIG. 3, the electronic device 100 can include the wide-view imaging camera 114, the narrow-view imaging camera 116, and the modulated light projector 119 disposed at the forward-facing surface 106. Although FIGS. 2 and 3 illustrate the imaging cameras 114, 116, and 118 and the modulated light projector 119 aligned along a straight line for the benefit of an example cross-section view in FIG. 4, the imaging cameras 114, 116, and 118 and the modulated light projector 119 may be offset relative to each other. For example, the modulated light projector 119 may be positioned at an offset from a line extending between the imaging cameras 114 and 116, or the modulated light projector 119 and the wide-angle imaging camera 114 may be disposed along a line parallel to the top edge of the electronic device 100 and the narrow-angle imaging camera 116 may be disposed at a location offset from this line. Moreover, although the modulated light projector 119 is illustrated as positioned between the imaging cameras 114 and 116, in other implementations the modulated light projector 119 may be positioned to the outside of one of the imaging cameras 114 and 116.

Figure 4:
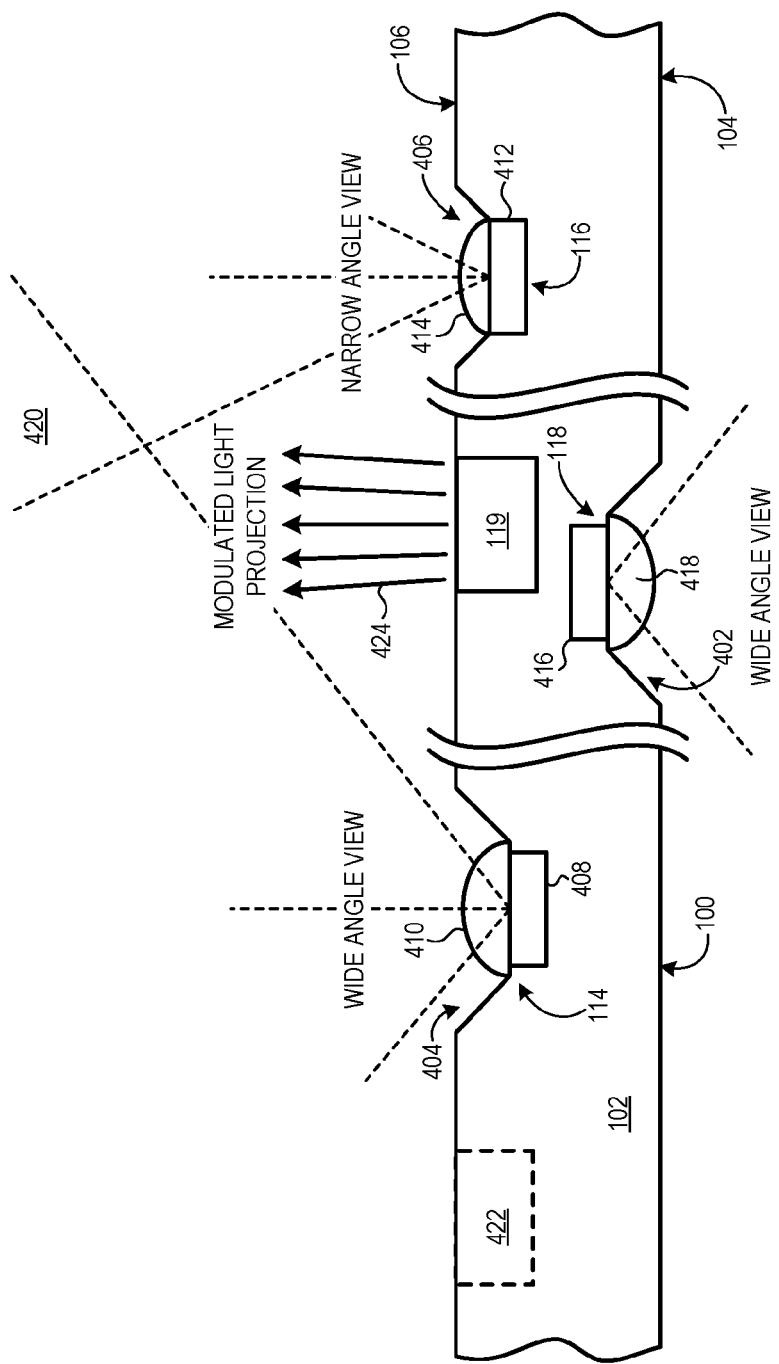
FIG. 4 is a diagram illustrating a cross-section view of the electronic device of FIG. 2 in accordance with at least one embodiment of the present disclosure.

FIG. 4 illustrates an example cross-section view 400 of the electronic device 100 along a line 210 depicted in the plan views of FIGS. 2 and 3 in accordance with at least one embodiment of the present disclosure. As illustrated, the electronic device 100 includes the user-facing imaging camera 118 disposed in an aperture 402 or other opening in the housing 102 at the user-facing surface 104 and includes the wide-angle imaging camera 114 and the narrow-angle imaging camera 116 disposed in apertures 404 and 406, respectively, or other openings in the housing 102 at the forward-facing surface 106. The wide-angle imaging camera 114 includes an image sensor 408 and one or more lenses 410 disposed over a sensing surface of the image sensor 408. The narrow-angle imaging camera 116 includes an image sensor 412 and one or more lenses 414 disposed over the sensing surface of the image sensor 412. Similarly, the user-facing imaging camera 118 includes an image sensor 416 and one or more lenses 418 disposed over the sensing surface of the image sensor 416.

The type of lens implemented for each imaging camera depends on the intended function of the imaging camera. As the forward-facing imaging camera 114, in one embodiment, is intended for machine vision-specific imagery for analyzing the local environment 112, the lens 410 may be implemented as a wide-angle lens or a fish-eye lens having, for example, an angle of view between 160-180 degrees with a known high distortion. The forward-facing imaging camera 116, in one embodiment, supports user-initiated image capture, and thus the lens 414 of the forward-facing imaging camera 116 may be implemented as a narrow-angle lens having, for example, an angle of view between 80-90 degrees horizontally. Note that these angles of view are exemplary only. The user-facing imaging camera 118 likewise may have other uses in addition to supporting local environment imaging or head tracking. For example, the user-facing imaging camera 118 also may be used to support video conferencing functionality for the electronic device 100. Accordingly, depending on the application the lens 418 of the user-facing imaging camera 118 can be implemented as a narrow-angle lens, a wide-angle lens, or a fish-eye lens.

The image sensors 408, 412, and 416 of the imaging cameras 114, 116, and 118, respectively, can be implemented as charge coupled device (CCD)-based sensors, complementary metal-oxide-semiconductor (CMOS) active pixel sensors, and the like. In a CMOS-based implementation, the image sensor may include a rolling shutter sensor whereby a group of one or more rows of pixel sensors of the image sensor is read out while all other rows on the sensor continue to be exposed. This approach has the benefit of providing increased sensitivity due to the longer exposure times or more usable light sensitive area, but with the drawback of being subject to distortion due to high-speed objects being captured in the frame. The effect of distortion can be minimized by implementing a global reset mechanism in the rolling shutter so that all of the pixels on the sensor begin collecting charge simultaneously, rather than on a row-by-row basis. In a CCD-based implementation, the image sensor can be implemented as a global shutter sensor whereby all pixels of the sensor are exposed at the same time and then transferred to a shielded area that can then be read out while the next image frame is being exposed. This approach has the benefit of being less susceptible to distortion, with the downside of generally decreased sensitivity due to the additional electronics required per pixel.

In some embodiments the fields of view of the wide-angle imaging camera 114 and the narrow-angle imaging camera 116 overlap in a region 420 so that objects in the local environment 112 (FIG. 1) in the region 420 are represented both in the image frame captured by the wide-angle imaging camera 114 and in the image frame concurrently captured by the narrow-angle imaging camera 116, thereby allowing the depth of the objects in the region 420 to be determined by the electronic device 100 through a multiview analysis of the two concurrent image frames. As such, the forward-facing imaging cameras 114 and 116 are positioned at the forward-facing surface 106 so that the region 420 covers an intended distance range and sweep relative to the electronic device 100. Moreover, as the multiview analysis relies on the parallax phenomena, the forward-facing imaging cameras 114 and 116 are sufficiently separated to provide adequate parallax for the multiview analysis.

Also illustrated in the cross-section view 400 are various example positions of the modulated light projector 119. The modulated light projector 119 projects an infrared modulated light pattern 424 in a direction generally perpendicular to the surface 106, and one or both of the forward-facing imaging cameras 114 and 116 are utilized to capture the reflection of the projected light pattern 424. In the depicted example, the modulated light projector 119 is disposed at the forward-facing surface 106 at a location between the imaging cameras 114 and 116. In other embodiments, the modulated light projector 119 can be disposed at a location between one of the imaging cameras and an edge of the housing 102, such as at a location 422 between the wide-angle imaging camera 114 and the side of the housing 102, or at a location (not shown) between the narrow-angle imaging camera 116 and the side of the housing 102.

Figure 6:
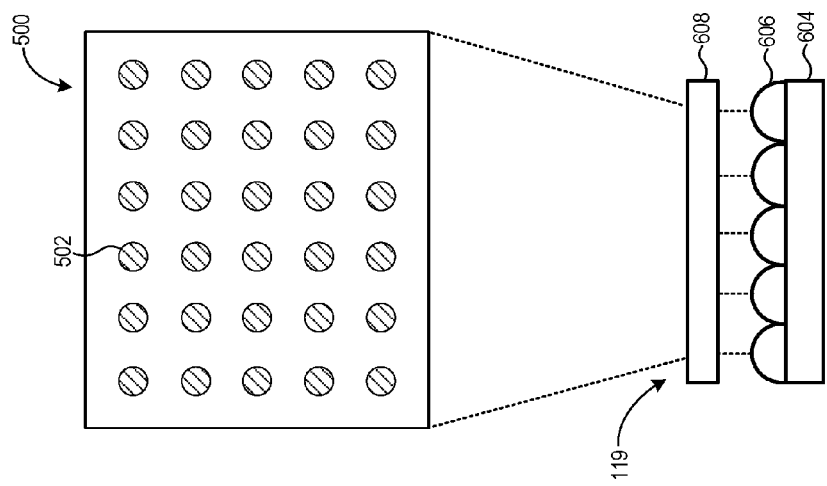
FIG. 6 is a diagram illustrating a cross-section view of a vertical-cavity surface-emitting laser (VECSEL) diode-based modulated light projector in accordance with at least one embodiment of the present disclosure.
Figure 5:
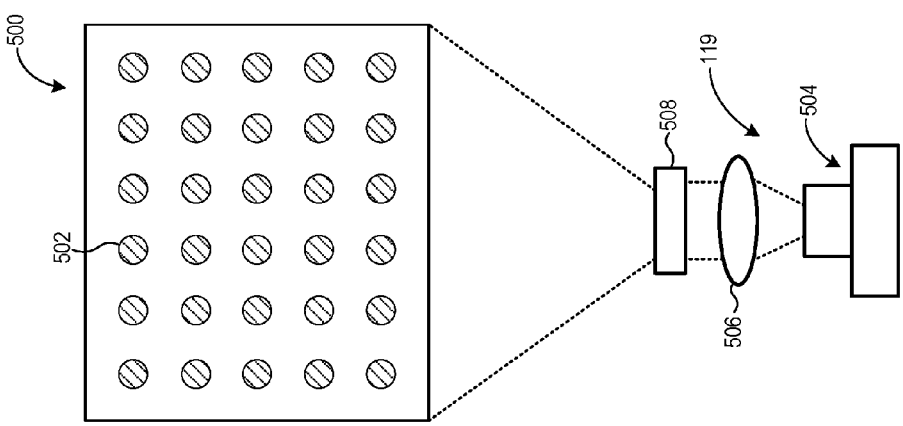
FIG. 5 is a diagram illustrating a cross-section view of a collimating lens-based modulated light projector in accordance with at least one embodiment of the present disclosure.

FIGS. 5 and 6 illustrate example implementations of the modulated light projector 119 in accordance with various embodiments of the present disclosure. In both instances, the modulated light projector 119 operates to project a modulated light pattern 500 composed of infrared light or, in some instances, visible light having a specified color or set of colors, or a specified frequency. In some embodiments, the modulated light pattern 500 comprises a spatially-modulated light pattern, such as the projection of a DeBruijn sequence, an M-array of light features (such as the illustrated matrix of dots 502, whereby the dots 502 are areas of high light intensity), and the like. Other spatially-modulated light patterns that may be implemented include, for example, concentric ring patterns or concentric rectangular patterns, parallel lines, or parallel and perpendicular lines (i.e., a grid), and the like. In other embodiments, the modulated light pattern 500 comprises a temporally-modulated (time-multiplexed) light pattern sequence, such as a binary code pattern sequence, an n-ary code pattern sequence, and the like. In temporally-modulated light applications, the depth sensor 120 determines the depth data through an analysis of a corresponding sequence of reflected light patterns, rather than through any reflected pattern individually.

The projection of the modulated light pattern 500 into the local environment of the electronic device 100 results in the reflection of light from objects in the local environment. Because the depth, or distance, of a surface of an object from the modulated light projector 119 impacts the reflection of the projected light incident on the surface, the electronic device 100 can use the pattern distortion present in the reflection of the modulated light pattern 500 to determine the depth of the object surface using any of a variety of well-known modulated light depth estimation techniques. Alternatively, both of the forward-facing imaging cameras 114 and 116 can be used to capture the reflection of the projected modulated light pattern 500 and multiview image analysis can be performed on the parallel captured depth imagery to determine the depths of objects in the local environment. In other embodiments, the electronic device 100 can use one or both of the forward-facing imaging cameras 114 and 116 as time-of-flight imaging cameras synchronized to the projection of the modulated light pattern 500, whereby the electronic device 100 calculates the depths of objects in the captured reflections using any of a variety of well-known time-of-flight depth algorithms. As yet another example, the electronic device 100 can employ a high-speed exposure shutter imaging camera (either as one of the forward-facing imaging cameras 114 and 116 or as a separate forward-facing imaging camera) that captures reflected light from a pulse of infrared light or near-infrared light from the modulated light projector 119, whereby the amount of reflected pulse signal collected for each pixel of the sensor corresponds to where within the depth range the pulse was reflected from, and can thus be used to calculate the distance to a corresponding point on the subject object. The ZCam™ imaging camera available from 3DV Systems, Inc. is an example of a commercial implementation of this type of imaging-based depth sensor.

In the example of FIG. 5, the modulated light projector 119 is implemented as an edge-emitting laser diode 504 that emits divergent IR laser light toward a collimating lens 506, which collimates the divergent laser light and directs the collimated laser light to a diffractive optical element (DOE) 508 (also frequently referred to as a "kinoform"), which generates the modulated light pattern 500 from the collimated laser light. The DOE 508, in one embodiment, can function in effect as a beam splitter to generate a pattern, such as an array of dots 502 illustrated in FIG. 5.

In the example of FIG. 6, the modulated light projector 119 is implemented using an array of one or more vertical-cavity surface-emitting laser (VCSEL) diodes 604 that emits divergent laser light. An array 606 of micro-lenses is disposed at the emitting surface of the one or more VCSEL diodes 604 for collimating and focusing the laser light from the VCSEL diode 604. A DOE 608 is disposed over the array 606 of micro-lenses to project the resulting collimated laser light as the modulated light pattern 500. The example implementation of FIG. 6 has the benefit of generally being thinner and having lower power consumption compared to edge-emitting laser diode implementations of comparable output. In some embodiments, the modulated light projector 119 further may include a focusing lens (not shown) disposed over the DOE 608.

Figure 7:
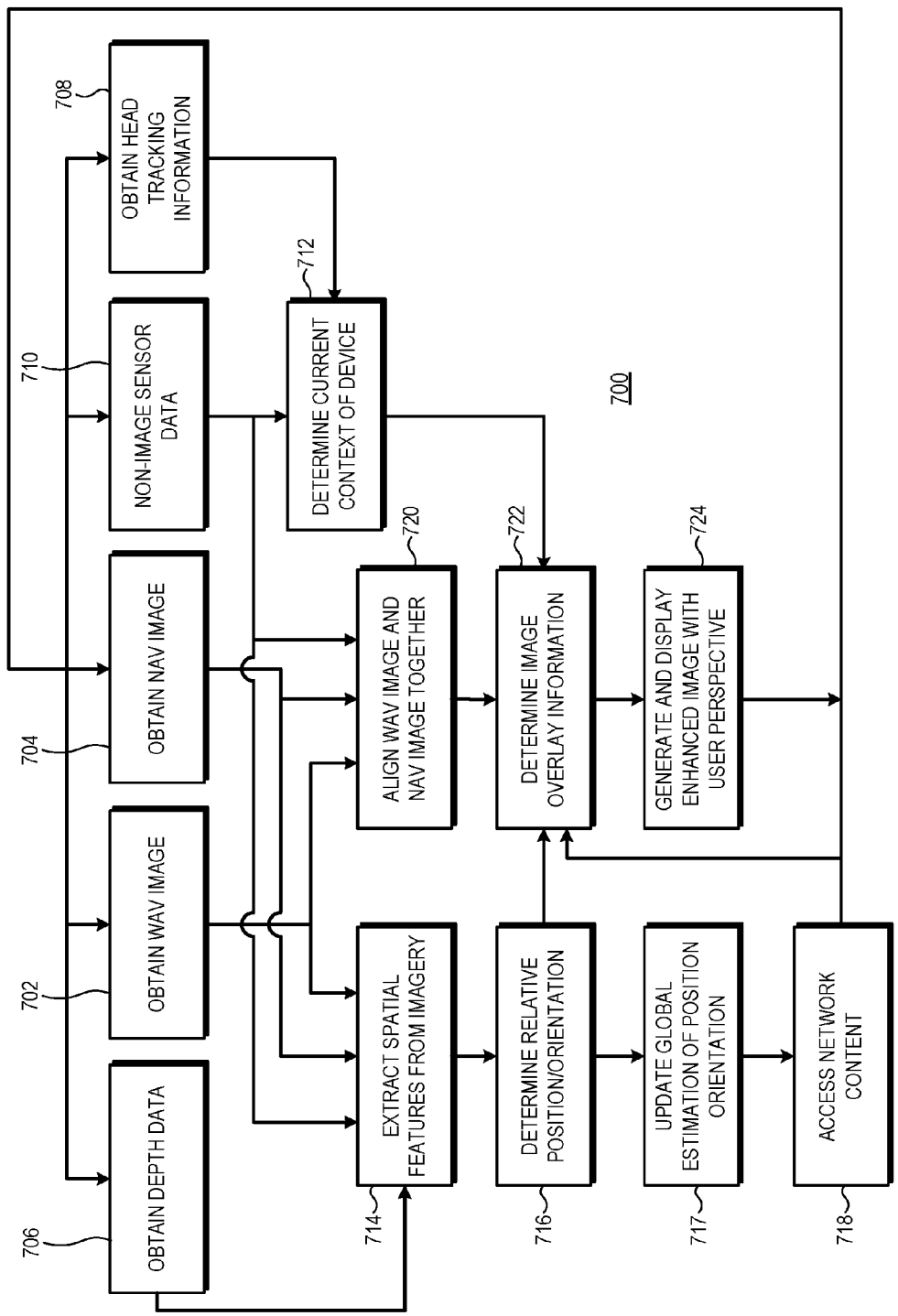
FIG. 7 is a flow diagram illustrating an operation of an electronic device to determine a relative position/orientation of the electronic device in a local environment based on image sensor data and non-image sensor data in accordance with at least one embodiment of the present disclosure.

FIG. 7 illustrates an example method 700 of operation of the electronic device 100 for providing location-based functionality in accordance with at least one embodiment of the present disclosure. For ease of illustration, the method 700 is depicted and generally described as a single loop of operations that can cycle repeatedly. However, not all operations must cycle at the same rate, as described in detail below. It is understood that the steps of the depicted flowchart of FIG. 7 can be performed in any order, and certain ones can be eliminated, and/or certain other ones can be added or repeated depending upon the implementation.

An iteration of method 700 initiates with the capture of various image sensor data and non-image sensor data. In one embodiment, the capture of the sensor data is triggered by, or otherwise synchronized to, the capture of concurrent image frames by one or more of the imaging cameras 114, 116, and 118 (FIG. 1) of the electronic device 100. In other embodiments, various sensor data may be periodically or otherwise repeatedly obtained and then synchronized to captured image data using timestamps or other synchronization metadata. This capture of sensor data can include the capture of wide angle view (WAV) image data for the local environment 112 (FIG. 1) via the wide-angle imaging camera 114 (FIG. 1) at block 702 and the capture of narrow angle view (NAV) image data for the local environment 112 via the narrow-angle imaging camera 116 at block 704. Further, in the event that the depth sensor 120 is activated, depth data for the local environment can be captured via the depth sensor 120 at block 706. Furthermore, head tracking data representing the current position of the user's head 122 can be obtained from the user-facing imaging camera 118 at block 708.

At block 710, the electronic device 100 captures sensor data from one or more non-image sensors. To this end, the electronic device 100 can implement any of a variety of non-image sensors to facilitate the determination of the relative position/orientation of the electronic device 100. Such non-image sensors can include one or more of a gyroscope, an accelerometer, a magnetometer, an altimeter, and a gravity gradiometer that provide explicit information pertaining to the relative position, orientation, or velocity of the electronic device 100. The non-image sensors also can include sensors to provide context for the local environment 112, such as ambient light sensors to sense the degree of ambient light incident on the electronic device and temperature gauges to sense the current temperature of the local environment. Further, the non-image sensor data obtained by the electronic device 100 can include implicit context information, such as keywords, search terms, or location indicia discerned from a user's manipulation of a keyboard or touchscreen of the electronic device 100 or discerned from the user's speech as captured by a microphone of the electronic device 100. The user's usage history likewise can serve as implicit context information.

It should be noted that different sensors may be read at different rates or frequencies. For example, an ambient light reading may be taken only once for every N image frame captures by the imaging cameras 114, 116, and 118, whereas a six-degrees-of-freedom (6DoF) reading from the gyroscope may be taken every image frame capture so as to enable detection of the relative orientation of the electronic device 100 when the corresponding image frame was captured. Still further, accelerometer readings may be obtained at a rate much higher than the image frame capture rate so as to facilitate a more accurate internal navigation determination by the electronic device 100.

At block 712, the electronic device 100 uses the captured non-image sensor data to determine a current context of the electronic device 100. The current context collectively represents non-position state information for the electronic device 100 that may facilitate the determination of the relative position of the electronic device 100 or that may facilitate the presentation of augmented information based on the determined relative position of the electronic device. This state information can include explicit state information, such as state information gleaned from various non-image sensors. Examples of explicit state information that may be represented in current context can include: the current 6DoF orientation of the electronic device 100; the current relative velocity of the electronic device 100; the current ambient light incident on the electronic device 100; the current time, day of week, or calendar date; the availability or signal strength of various wireless signaling (e.g., signaling from a cellular base station or wireless local area network access point); and the like. The state information represented in the current context also can include implicit state information; that is, information implied from other information available to the electronic device 100. Examples of implicit state information can include: a keyword search or key term analysis of recent text input by the user via a keyboard or touchscreen; recent web searches performed by the user via the electronic device 100; a history of the user's location-related habits (e.g., an history of the user's commutes to and from work); hints at the user's intended destination from an analysis of e-mail or other records stored at the electronic device 100 or at a remote location; and the like.

At block 714 the electronic device 100 analyzes the captured image sensor data and depth data to identify spatial features of the local environment 112 that are represented in the captured imagery. Spatial features that may be so identified can include simple structures in the captured imagery, such as edges and corners or other interest points, or may include more complex structures, such as curves, planes, blobs, or entire objects. The electronic device 100 can utilize any of a variety of well-known digital image processing techniques to extract spatial features from the captured image frames, such as the Canny edge detector or the Sobel operator to detect edges, the FAST corner detector or the Harris and Stephens corner detector to detect corners, or the Laplacian of Gaussian (LoG) or the Difference of Gaussian (DoG) detectors to detect corners or blob objects.

The electronic device 100 can perform the spatial feature detection process for one or more of the wide angle view (WAV) image frame captured by the wide-angle imaging camera 114, the narrow angle view (NAV) image frame captured by the narrow-angle imaging camera, the image frame captured by the user-facing imaging camera 118, as well as the reflected modulated light image frame captured by the depth sensor 120 (which may include an image frame captured by one of the forward-facing imaging cameras 114 and 116).

The identification of the spatial features in an image provides the relative location of those spatial features in a two-dimensional space, that is, "2D spatial features." In order to map a 2D spatial feature to a third dimension (i.e., the distance, or "depth" from the electronic device 100), that is, to determine the corresponding "3D image feature", the electronic device 100 determines the depth of the 2D feature relative to the electronic device 100 using one or both of multiview image analysis or analysis using the depth sensor data.

For multiview image analysis, the electronic device 100 relies on the parallax phenomenon by matching spatial features identified in the WAV image frame to spatial features identified in the corresponding NAV image frame using any of a variety of feature matching techniques, and then calculating the relative depth of each spatial feature based on the shift in position of the spatial feature between the two image frames and based on the distance between the optical axis of the wide-angle imaging camera 114 and the optical axis of the narrow-angle imaging camera 116. For identifying the depth of a 2D feature using the depth sensor data, the electronic device 100 matches spatial features identified in at least one of the visible-light image frames (that is, one of the NAV image frame or the WAV image frame) to spatial features identified in the depth sensor data, and the electronic device 100 can determine an identified visible-light spatial feature as having the depth-distance indicated by a matching spatial feature from the depth sensor data. Rather than, or in addition to, using the WAV image frame or NAV image frame, in some embodiments the electronic device 100 can use an aligned (or "stitched") image frame generated from the alignment and combination (or "stitching") of the WAV image frame and the NAV image frame, as described below with reference to block 720.

With the 3D spatial features identified in the current captured imagery of the local environment 112, at block 716 the electronic device 100 determines or updates its current relative position/orientation based on an analysis of the 3D spatial features. In one embodiment, the electronic device 100 implements a visual odometry-based position/orientation detection process whereby the electronic device 100 determines its new position/orientation relative to its previously determined position/orientation based on the shifts in positions of the same spatial features between current captured imagery and previously-captured imagery in a process commonly referred to as "optical flow estimation," Example algorithms for optical flow estimation includes the well-known Lucas-Kanade method, as well as template-based approaches or feature descriptor matching-based approaches.

In some embodiments, the electronic device 100 utilizes the current context determined at block 712 to aid the determination of the current position/orientation. In some implementations, the current context is used to verify or refine a position/orientation reading originally determined through imagery analysis. To illustrate, the electronic device 100 may determine an orientation reading from the imagery analysis and then use the most recent 6DoF reading from a gyroscope sensor to verify the accuracy of the image-based orientation reading. As another example, the electronic device 100 may determine a current position from imagery analysis, determine the average velocity the electronic device 100 would have needed to travel at to transition from the previously determined position to the current position, and then verify that this estimated velocity with one or more readings from an accelerometer so as to verify that the estimated current position is consistent with the measured velocity readings. In some embodiments, the electronic device 100 utilizes the current context determined at block 712 to filter the image data to be utilized in performing the imagery analysis for position/orientation detection. As one example, the electronic device 100 may use a 6DoF reading from a gyroscope or a gravitational orientation reading from a gravity gradiometer to determine the current gravitational orientation of the electronic device 100 and use this information to avoid spatial feature correlation efforts for potential spatial feature matches that would not be possible given the gravitational orientation of the electronic device 100.

Further, the electronic device 100 may use user-provided location context to more precisely identify the general location or area of the electronic device 100. As an example, the electronic device 100 may detect a reference to a particular shopping mall in the user's recent email, audio, or text messaging communications, and thus infer that the user is located at the shopping mall. From this, the electronic device 100 can, for example, access a database having location/mapping information for the shopping mall and focus the imagery-based localization based on this location/mapping information.

Mobile robots often implement simultaneous localization and mapping (SLAM) algorithms to both map a local environment and determine their relative location within the mapped environment without a priori knowledge of the local environment. The electronic device 100 can utilize these same SLAM techniques using multiple iterations of the position/orientation determination process of block 716 over time so as to generate a map of the local environment 112 while concurrently determining and updating the position/ orientation of the electronic device 100 at each appropriate point in time. This local mapping information can be utilized by the electronic device 100 to support any of a variety of location-based functionality, such as use in determining a path for a user to a specified destination and providing visual navigational aids to the user according to this path, as described in greater detail below.

In some embodiments, the electronic device 100 may maintain estimates of the global, or absolute, position/orientation of spatial features identified in the local environment 112. To this end, the electronic device 100 may, at block 717, update global location estimations of spatial features identified at block 714 using non-image sensor data representative of global position/orientation information, such as sensor data captured at block 710 from a GPS receiver, a magnetometer, gyrocompass, and the like. This global position/orientation information may be used to determine the global position/orientation of the electronic device 100, and from this information, the electronic device 100 can estimate the global position/orientations of identified spatial features based on their positions/orientations relative to the electronic device 100. The electronic device 100 then may store or update this estimated global position/orientation for a spatial feature as metadata associated with the spatial feature.

Moreover, the electronic device 100 can use these estimates of the global positions/orientations of spatial features to selectively forgo the process of obtaining updates to certain non-image sensor data at an iteration of block 710. For example, if the electronic device 100 identifies a repeating spatial feature (that is a spatial feature also identified from a previous iteration of block 714), the electronic device 100 can use the estimate of the global position/orientation of this repeated spatial feature in place of certain other non-image sensor data, such as GPS data from a GPS receiver. In a similar approach, the electronic device 100 also can use the estimated global positions/orientations previously determined for one or more spatial features to assign estimated global positions/orientations to newly-encountered spatial features based on their estimated positions/orientations relative to the previously-mapped spatial features.

With the determination of the current position/orientation of the electronic device 100 and various spatial features identified from the image data captured at the current position/orientation, at block 718 the electronic device 100 can access network content based on the current position/orientation so as to support certain location-based functionality of the electronic device 100 or to support certain location-based functionality of a networked system in communication with the electronic device 100. As an example, the electronic device 100 may support a networked multi-player video game that provides a virtual reality based on the local area of the electronic device 100. With the current position/orientation, the electronic device 100 can access player state information so as to display the positions of other players relative to the current position of the electronic device 100. As another example, the electronic device 100 may support a friend-mapping application that maps the locations of friends, colleagues and other persons of interest to the user. The electronic device 100 can provide its current position to a centralized server, which both updates other users' accounts to reflect the current position and updates the electronic device 100 with other users that are within a specified distance of the current location.

In addition to, or instead of, downloading network content, the electronic device 100 may upload device content to a network at block 718. The uploaded device content may include, for example, image data, information pertaining to identified spatial features and their corresponding metadata, relative position/orientation information, estimated absolute position/orientation information, and the like. This uploaded device content may be assimilated into a database of such information from a multitude of similar devices, and this database then may be used to provide various location-based services. For example, content data from the electronic device 100 may be integrated with similar content to provide imagery, location, and routing information for network-connected navigation/mapping software applications.

As noted above, the electronic device 100 can include a display 108 (FIG. 1) to display imagery of the local environment 112 captured using one or both of the forward-facing imaging cameras 114 and 116. The displayed imagery also can include augmented reality graphical information, such as the example described above with reference to FIG. 1 whereby the positions of electrical wiring in the walls of an office are noted in a graphical overlay synchronized to the displayed imagery of the walls. To this end, at block 720 the electronic device 100 performs an image alignment process to combine one or more WAV images and one or more NAV images captured at one or more iterations of blocks 702 and 704 to form a single combined image frame. The image alignment process can add detail from a NAV image to a WAV image to provide a more detailed version of the WAV image, or vice versa. Alternatively, multiple NAV images can be aligned and combined to form a single image frame that depicts a larger area (e.g., a panorama) than the individual NAV images. In other embodiments, the electronic device 100 can instead elect to present either the WAV image or the NAV image without modification.

At block 722, the electronic device 100 determines the AR information to be graphically presented to the user as a graphical overlay for the image frame generated or selected at block 720 and provides the image frame and the graphical overlay for display at the electronic device 100 at block 724. The AR information can be locally stored at the electronic device 100, such as in a hard drive or a removable media storage device. As discussed above with reference to block 718, the AR information may be remotely stored, such as at an Internet-connected server accessed by the electronic device 100 via a WLAN or cellular data connection, and AR information may be accessed in response to the determination of the current position/orientation. The particular AR information presented to the user in conjunction with the image frame can be selected based on explicit user information, such as by the user selecting the virtual display of the positions of heating, ventilation, and air conditioning (HVAC) ducts within the walls, floors, and ceilings of the local environment 112. The AR information selected for presentation also can be selected based on implicit selection criteria. For example, in response to detecting that the user is traveling toward a specified destination identified in the user's text message communications, the electronic device 100 can generate AR information that presents various metrics pertaining to the user's progress toward the destination, such as the estimated time needed to reach the destination from the user's current position, the compass direction of the destination relative to the user's current position, and the like.

The view perspective of the AR information presented in the graphical overlay often may be dependent on the particular position/orientation of the electronic device 100 as determined at block 716. For example, a user may interface with a GUI of the electronic device 100 to direct the electronic device 100 to aid the user in finding an exit door.

Assuming the electronic device 100 has mapped the local environment 112 though a SLAM process at block 716 and has identified the exit door through this mapping, the electronic device 100 can use the current position of the electronic device 100 relative to this mapping to determine a route through the local environment to the exit door and then use the orientation of the electronic device 100 to direct navigational arrow graphics that navigate the user to the exit door. As the user (and the electronic device 100) moves along the path to the exit door, the electronic device 100 can update the navigational arrow graphic presented to reflect any changes in direction necessary to continue navigating the path to the exit door. In a more sophisticated application, electrical wiring and HVAC duct location information for the office may be stored in a computer-aided drawing (CAD) form such that the electronic device 100 can present the graphical representations of the electrical wiring and HVAC duct locations present in the presented image frame of the area of the office facing the rear of the electronic device 100 in a three-dimensional form that correlates to the relative positions/orientations of the corresponding walls, floors, and ceilings present in the presented image. As the user moves the electronic device 100 around the office, the presented image of the local environment 112 changes and thus the electronic device 100 updates the electrical wiring and HVAC duct overlay to reflect the changes in the area of the office presented as imagery at the display 108.

The view perspective presented by the graphical overlay also may be modified based on changes in the position of the user's head (or the user's eyes) relative to the display 108. To this end, the electronic device 100 can react to head/eye position changes as represented in the head tracking or eye tracking information captured at block 708 to change the view perspective of the image and graphical overlay presented at the display 108.

As noted above, the electronic device 100 cycles through iterations of the method 700 to provide real-time, updated localization, mapping, and augmented reality display. However, these sub-processes do not necessarily cycle at the same rate. To illustrate, the image alignment and AR processes may update/cycle at the same frame rate as the imaging cameras 114, 116, and 118 because these processes are directly tied to the captured imagery. However, the non-image sensor capture and current context determination may proceed at different cycle rates. To illustrate, it may be appropriate to capture gyroscopic or inertial sensor states more frequently than the frame rate in order to have sufficiently accurate inertial navigation estimation. Conversely, the location-related features of the electronic device 100 may not require a high position resolution, and thus the image analysis process to determine the current position/orientation of the electronic device 100 may occur at a cycle rate slower than the frame rate of the imaging cameras.

Figure 8:
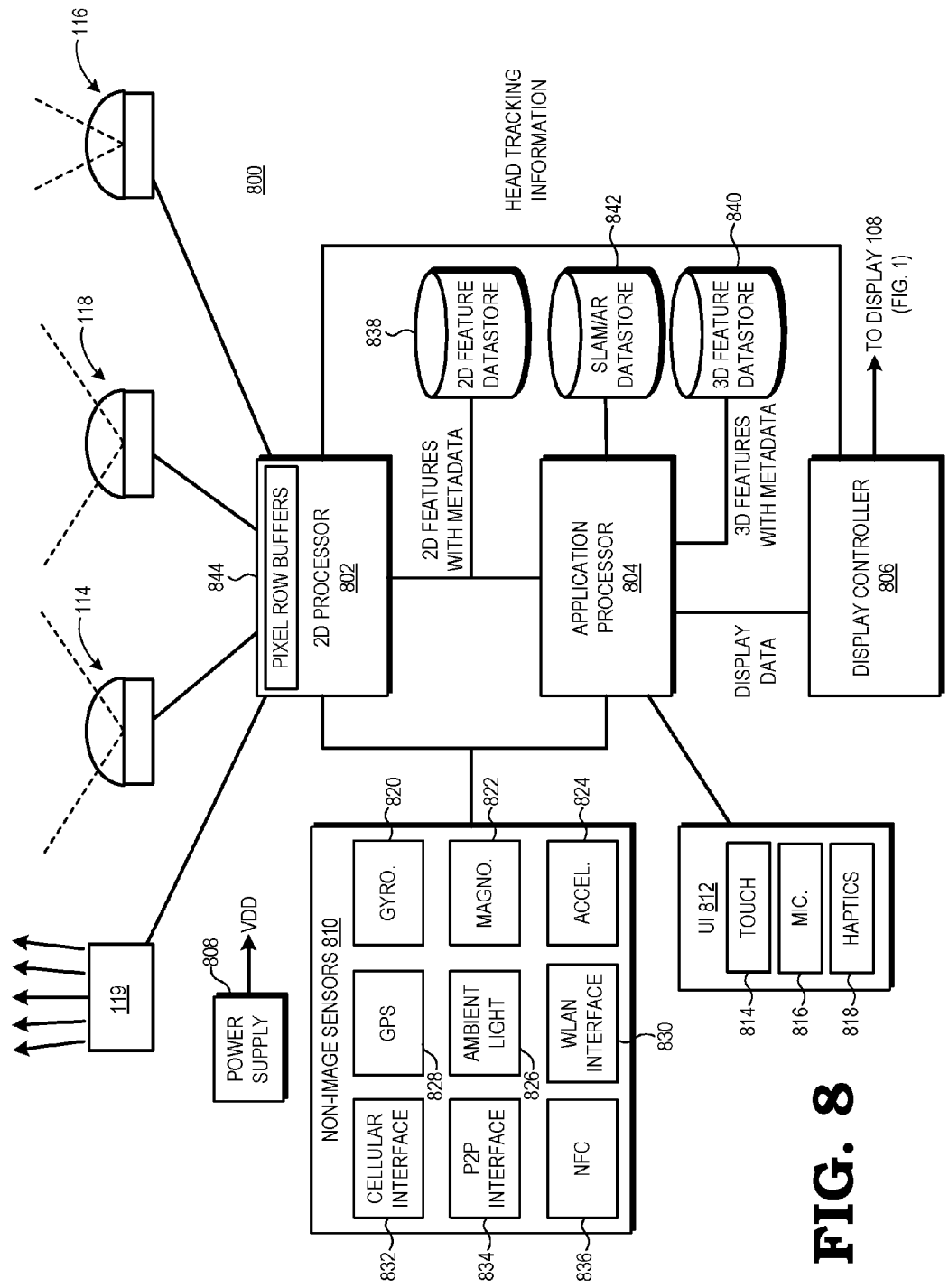
FIG. 8 is a block diagram illustrating a processing system of an electronic device for determining two-dimensional (2D) and three-dimensional (3D) spatial feature data from captured imagery of a local environment in accordance with at least one embodiment of the present disclosure.

FIG. 8 illustrates an example processing system 800 implemented by the electronic device 100 in accordance with at least one embodiment of the present disclosure. The processing system 800 includes the wide-angle imaging camera 114, the narrow-angle imaging camera 116, the user-facing imaging camera 118, and the depth sensor 120. The processing system 800 further includes a 2D processor 802, an application processor 804, a display controller 806, a power supply 808, a set 810 of non-image sensors, and a user interface 812.

In a portable user device implementation, such as a tablet computer or smartphone implementation, the power supply 808 can include a battery, solar array, or other portable power source used to power the electrical components of the electronic device. In a non-portable device implementation, the power supply 808 can include a power converter to convert an external voltage supply to a voltage level appropriate for the components of the electronic device 100. The user interface 812 includes one or more components manipulated by the user to provide user input to the electronic device 100, such as a touchscreen 814, a mouse, a keyboard, a microphone 816, various buttons or switches, and various haptic actuators 818. The set 810 of non-image sensors can include any of a variety of sensors used to provide non-image context or state of the electronic device 100. Examples of such sensors include a gyroscope 820, a magnetometer 822, an accelerometer 824, and an ambient light sensor 826. The non-image sensors further can include various wireless reception or transmission based sensors, such as a GPS receiver 828, a wireless local area network (WLAN) interface 830, a cellular interface 832, a peer-to-peer (P2P) wireless interface 834, and a near field communications (NFC) interface 836. The non-image sensors also can include user input components of the user interface 812, such as the touchscreen 814 or the microphone 816.

The electronic device 100 further has access to various datastores storing information or metadata used in conjunction with its image processing, location mapping, and location-utilization processes. These datastores can include a 2D feature datastore 838 to store metadata for 2D spatial features identified from imagery captured by the imaging cameras of the electronic device 100 and a 3D spatial feature datastore 840 to store metadata for 3D features identified from depth sensing for the 2D spatial features using multi-view analysis or modulated light-based depth sensing. The metadata stored for the 2D and 3D features can include, for example, timestamps for synchronization purposes, image frame identifiers of the image frames in which the spatial features were identified, identifiers of the capture device used, calibration information, and the like. This metadata further can include non-image sensor data that was contemporaneously with the image frame containing the identified spatial feature, such as GPS, wifi, or other radio information, time-of-day information, weather condition information (which affects the lighting), and the like. The datastores further can include a SLAM/AR datastore 842 that stores SLAM-based information, such as mapping information for areas of the local environment 112 (FIG. 1) already explored by the electronic device 100, or AR information, such as CAD-based representations of the relative locations of objects of interest in the local environment 112. The datastores may be local to the electronic device 100, such as on a hard drive, solid state memory, or removable storage medium (not shown), the datastores may be remotely located and accessible via, for example, one or more of the wireless interfaces of the electronic device 100, or the datastores may be implemented as a combination of local and remote data storage.

In the depicted implementation, the processing system 800 employs two processors: the 2D processor 802 configured to efficiently identify 2D spatial features from visible-light imagery and depth sensor imagery captured by the imaging cameras of the electronic device 100; and the application processor 804 configured to efficiently identify 3D spatial features from the 2D spatial features and to efficiently provide location-based functionality, such as visual odometry or other SLAM functionality, AR functionality, and the like. However, in other embodiments, the described functionality of the 2D processor 802 and the application processor 804 may be implemented in a single processor, or more than two processors together may implement the described functionality. The 2D processor 802 can be implemented as, for example, a single-core or multiple-core graphics processing unit (GPU) and the application processor 804 can be implemented as, for example, a GPU or a single-core or multiple-core central processing unit (CPU).

The 2D processor 802 is coupled to the wide-angle imaging camera 114, the narrow-angle imaging camera 116, and the user-facing imaging camera 118 so as to receive image data captured by the imaging cameras in one or more pixel row buffers 844. In one embodiment, the 2D processor 802 includes an interface and a pixel row buffer 844 for each imaging camera so as to be able to receive image data from each imaging camera in parallel. In another embodiment, the 2D processor 802 includes a single interface and a pixel row buffer 844 and thus the 2D processor 802 multiplexes between the imaging cameras. The pixel row buffer 844 can include storage sufficient for one or more rows of pixels (up to a full frame buffer) from the image frames captured by the corresponding imaging camera. To illustrate, one or more of the imaging cameras may include rolling shutter imaging cameras whereby the image sensor of the imaging camera is scanned one row at a time, or a subset of rows at a time. As each row or row subset is scanned, its pixel data is temporarily buffered at the pixel row buffer 844. The buffered rows of pixels then may be transferred to a larger storage area, such as a separate frame buffer (not shown) for full frame processing.

The 2D processor 802 is configured to process the captured image data from the imaging cameras to identify 2D spatial features present in the image data. In some embodiments, the 2D processor 802 implements a hardware configuration specifically designed for this task. In other embodiments, the 2D processor 802 includes a more general processor architecture that provides the 2D spatial feature detection through execution of a software program configured to implement the 2D spatial feature detection process. The 2D processor 802 also may implement a combination of specialized hardware and specialized software for this purpose. As described above, any of a variety of well-known 2D spatial feature detection or extraction algorithms may be implemented by the 2D processor 802. The 2D processor 802 stores metadata and other information pertaining to the identified 2D spatial features to the 2D feature datastore 838.

The 2D processor 802, in one embodiment, is configured to analyze imagery captured by the user-facing imaging camera 118 to track the current position/orientation of the user's head using any of a variety of well-known head tracking algorithms. In the depicted example, the 2D processor 802 provides the head tracking information to the display controller 806, which in turn is configured to adjust the displayed imagery to react to changes in the user's view perspective as reflected in changes in position/orientation of the user's head. In another embodiment, the 2D processor 802 provides the head tracking information to the application processor 804, which in turn modifies the display data to reflect updated view perspectives before the display data is provided to the display controller 806.

The 2D processor 802 also acts as a controller that operates the modulated light projector 119 in its use in determining depth data for spatial features identified in the captured imagery of the local environment 112. In certain conditions, such as relatively bright settings (as sensed using the ambient light sensor 826), the 2D processor 802 may use multiview image analysis of imagery concurrently captured by the wide-angle imaging camera 114 and the narrow-angle imaging camera 116 to determine depth data for spatial features present in the captured imagery. In other conditions, such as relatively low lighting conditions, the 2D processor 802 may switch to the use of the depth sensor 120 (FIG. 1) to determine this depth data. In other embodiments, the processing system 800 implements a controller (described below with reference to FIG. 13) separate from the 2D processor 802 to at least partially control the operation of the modulated light projector 119.

As described above, the depth sensor 120 relies on the projection of a modulated light pattern, or a "modulated light flash," by the modulated light projector 119 into the local environment and on the capture of the reflection of the modulated light pattern therefrom by one or more of the imaging cameras. Thus, the 2D processor 802 may use one or both of the forward-facing imaging cameras 114 and 116 to capture the reflection of a projection of the modulated light pattern and process the resulting imagery of the reflected modulated light pattern to determine the depths of corresponding spatial features represented in the reflected modulated light pattern. To match a depth reading with a corresponding 2D spatial feature, the 2D processor 802 can perform a 2D spatial feature analysis on the depth imagery to determine a 2D spatial feature and its relative depth, and then attempt to match the 2D spatial feature to a corresponding spatial feature identified in the visual-light imagery captured at or near the same time as the reflected modulated light imagery was captured. In another embodiment, the 2D processor 802 can capture a visible-light image, and quickly thereafter control the modulated light projector 119 to project a modulated light pattern and capture a reflected modulated light image. The 2D processor 802 then can develop a depth map for the visible-light image from the reflected modulated light image as they effectively represent the same scene with the same spatial features at the same coordinates due to the contemporaneous capture of the visible-light image and the reflected modulated light image.

While effective in aiding the sensing of relative depths of spatial features present in captured imagery, the projection of the modulated light pattern can interfere with other operations of the electronic device 100. For one, while the modulated light projector 119 can be configured to project an infrared or near-infrared light pattern, the reflection of this infrared or near-infrared light can introduce interference into the ambient-light, or visible-light, imagery captured by the imaging cameras should they happen to activate their shutters while the modulated light pattern is being projected. This interference can both detract from the user's viewing experience of the captured visible-light imagery, as well as negatively impact the accuracy or efficacy of the image processing performed by the 2D processor 802. Moreover, the activation of the modulated light projector 119 can consume a significant amount of power, which can impact the run time of the electronic device 100 between battery recharges. Various techniques implementable by the processing system 800 for reducing interference and power consumption by the modulated light projector 119 are described below with reference to FIGS. 10-20.

The application processor 804 is configured to identify 3D spatial features represented in the captured imagery using the 2D spatial features represented in the 2D feature datastore 838 and using non-image sensor information from the set 810 of non-image sensors. As with the 2D processor 802, the application processor 804 may be configured to perform this process through a specialized hardware configuration, through execution of software configured for this process, or a combination of specialized hardware and software. Metadata and other information for the identified 3D spatial features is stored in the 3D feature datastore 840. A 2D-to-3D spatial feature extraction process is described below with reference to FIG. 9.

The application processor 804 further is configured to provide SLAM, AR, VR, and other location-based functionality using 3D spatial features represented in the 3D feature datastore 840 and using the current context of the electronic device 100 as represented by non-image sensor data. The current context can include explicit or implicit user input obtained from, for example, the user interface 812 or via an analysis of user interactions. This functionality can include determining the current relative position/orientation of the electronic device 100 based on a visual odometry process that uses the 3D spatial features and various location-related non-image sensor data, such as a 6DoF reading from the gyroscope 820, a dead-reckoning history maintained using the accelerometer 824, a coarse absolute positional indicator determined using the GPS receiver 828 or determined using radio telemetry via the cellular interface 832, and the like. Similarly, the application processor 804 can use a history of positions/orientations of the electronic device 100 and a history of spatial features observed in those positions/orientations to create a map of the local environment 112.

The location-based functionality provided by the application processor 804 further can include AR-related or VR-related functionality that includes identifying and accessing from the SLAM/AR datastore 842 graphical information to be provided as a graphical overlay on the display 108 based on the current position/orientation determined by the application processor 804. This graphical overlay can be provided in association with imagery captured by the imaging cameras in the current position/orientation for display at the display 108 via the display controller 806. The display controller 806 operates to control the display 108 (FIG. 1) to display imagery represented by display data received from the application processor 804. Further, in some embodiments, the display controller 806 can receive head tracking information from the 2D processor 802 and adjust the view perspective of the imagery being displayed based on the user head position or eye position represented in the received head tracking information.

In a conventional 2D spatial feature detection application, an entire image frame is captured and then buffered at a frame buffer before a GPU or other processor initiates spatial feature extraction for the image frame. This approach can introduce a significant delay or lag in the spatial feature detection, and thus introduce a significant delay or lag in position/orientation detection, due to the delay incurred in transferring the image data to the frame buffer in preparation for its access by the GPU. To reduce or eliminate this lag, in some embodiments the 2D processor 802 is configured to perform 2D spatial feature extraction as captured image data is streamed to the 2D processor from a corresponding imaging camera. As the pixel row buffer 844 receives a subset of one or more pixel rows from the imaging camera, the 2D processor 802 processes the image portion represented by the subset of buffered pixels to identify 2D spatial features present in the image portion. The 2D processor 802 then may stream 2D spatial features to the 2D feature datastore 838, or directly to an input of the application processor 804, as they are identified from the image portion. As 2D spatial features are identified as the image data is streamed in, and as the identified 2D spatial features are streamed to the application processor 804 as they are identified, the 2D spatial feature detection process and the 3D spatial feature detection process can proceed at a faster rate compared to conventional image processing techniques that rely on whole image frame analysis.

Figure 9:
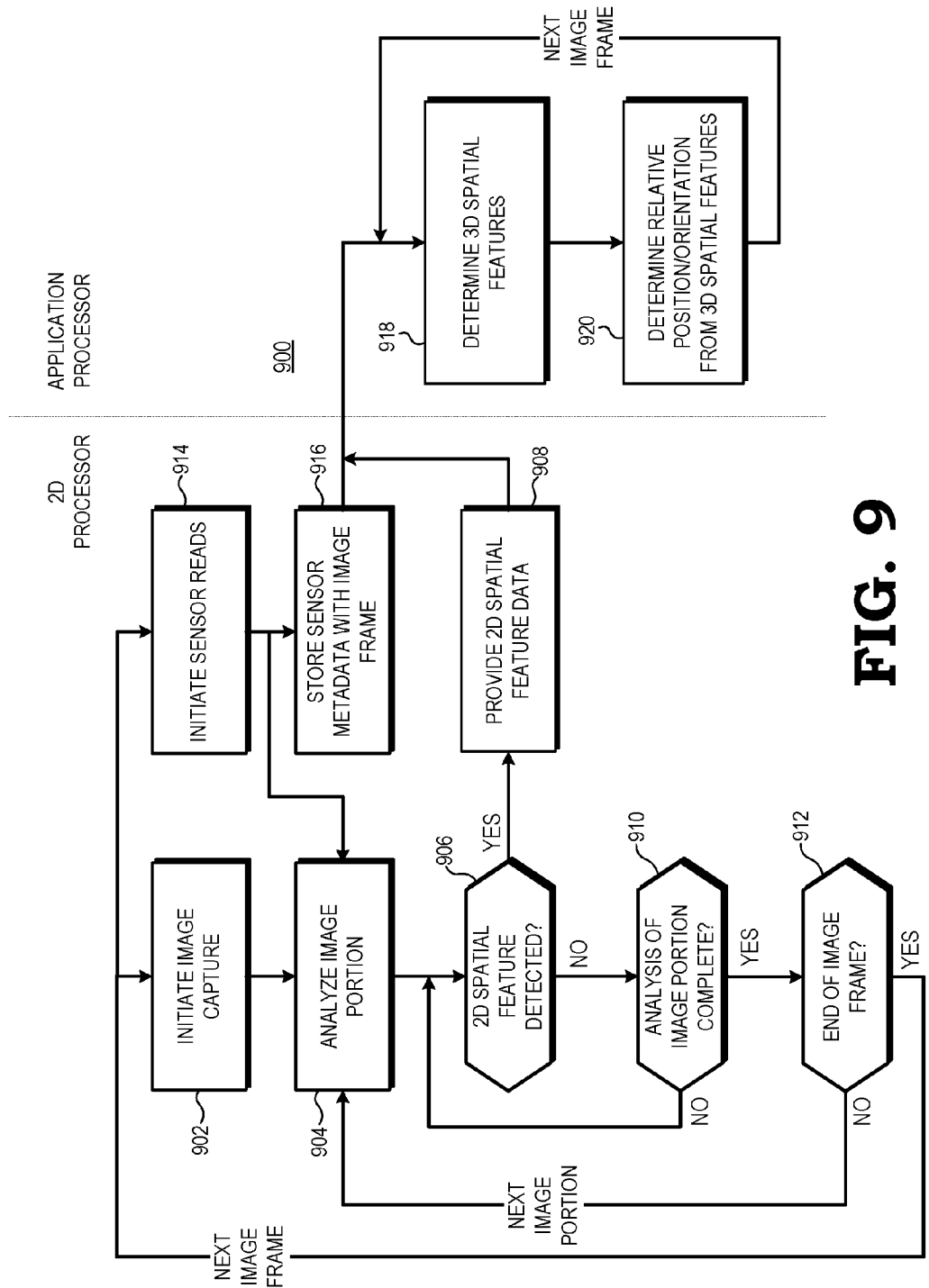
FIG. 9 is as flow diagram illustrating an operation of the processing system of FIG. 8 for 2D and 3D spatial feature extraction in accordance with at least one embodiment of the present disclosure.

FIG. 9 illustrates an example method 900 for 2D and 3D spatial feature extraction using the two-processor architecture of processing system 800 in accordance with at least one embodiment. An iteration of method 900 starts with the initiation of the capture of an image by one of the forward-facing imaging cameras 114 and 116 at block 902. At block 904, the 2D processor 802 scans a portion of the image being captured at the image sensor of the imaging camera into the pixel row buffer 844 and analyzes the image portion from the pixel row buffer 844 to identify any 2D spatial features present in the image portion. In response to detecting a 2D feature (block 906), the 2D processor 802 provides 2D spatial feature data representing the 2D feature for storage in the 2D feature database 838 at block 908. This 2D spatial feature data can include, for example, a spatial feature identifier, an indicator of the image in which the spatial feature was found or a time stamp associated with such image, an indicator of a position of the spatial feature within the image, an indicator of the type of spatial feature (e.g., edge, corner, etc.), and the like. The 2D processor 802 repeats the process of blocks 904, 906, and 908 until spatial feature extraction for the image portion is complete (block 910), at which point the method 900 returns to block 904, whereupon the next image portion is scanned from the image sensor of the imaging camera to the pixel row buffer 844 and the 2D spatial feature extraction process of blocks 904-910 repeats for this next image portion. When 2D spatial feature extraction of the last image portion of the image frame has been completed (block 912), the method 900 returns to block 902 and the process is repeated for the next image captured by an imaging camera of the electronic device 100.

Contemporaneously with the image capture and analysis process of blocks 902-912, the 2D processor 802 determines a current context of the electronic device 100 that is to be associated with the captured image. To this end, at block 914 the 2D processor 802 initiates the reading of one or more of the non-image sensors and uses the resulting non-image sensor data to specify one or more parameters of the current context of the electronic device 100. This can include, for example, specifying the 6DoF orientation of the electronic device 100 at the time the image was captured at block 902, specifying the ambient light incident on the electronic device 100 at this time, specifying a received signal strength indication (RSSI) for cellular signaling, specifying GPS coordinates of the electronic device 100 at this time, and the like. At block 916, the 2D processor 802 provides this current context information for storage in the 2D feature datastore as metadata associated with the 2D spatial features identified in the concurrently captured image frame. The current context capture process of blocks 914 and 916 then may repeat for the next image capture cycle.

As noted, in some embodiments, the 2D processor 802 streams the 2D spatial features and their associated context metadata to the application processor 804 as the 2D spatial features are identified. Accordingly, as 2D spatial feature data and metadata for a 2D spatial feature is received, at block 918 the application processor 804 converts the 2D spatial feature to a 3D spatial feature by determining the current depth of the 2D spatial feature. As noted, where two concurrently captured images are available, the depth of a spatial feature may be determined through multiview analysis of the two images. In this case, the application processor 804 correlates 2D spatial features from the two frames to identify a set of 2D spatial features that likely represent the same spatial feature and then determines the depth of the 2D spatial feature based on the parallax exhibited between the positions of the spatial feature between the two images. In instances where two concurrently captured images are not available, the application processor 804 can determine the current depth of the received 2D spatial feature based on the depth data concurrently captured by the depth sensor 120.

With the generation of the 3D spatial feature, at block 920 the application processor 804 may attempt to determine the current position/orientation of the electronic device 100 through the application of a visual odometry algorithm to this 3D spatial feature. In some instances, the 3D spatial feature, by itself, may not be sufficiently distinct so as to allow an accurate determination of the current position/orientation. Accordingly, the electronic device 100 may buffer 3D spatial feature data representing multiple contemporaneous 3D spatial features and then attempt to determine the current position/orientation from these multiple 3D spatial features.

In the approach described above, the application processor 804 may be able to identify the current position/orientation with sufficient granularity using one or a few 3D spatial features. As each 3D spatial feature can be determined shortly after the corresponding 2D spatial feature is identified, the application processor 804 can begin the process of determining the current position/orientation even before the 2D processor 802 has completed the capture and processing of the image frame from the imaging camera. This ability to rapidly determine the current position/orientation can translate to improved location-based functionality. To illustrate, as the current position/orientation can be identified quicker than a conventional approach which requires first filling the frame buffer, AR graphical overlay information may be accessed and displayed more rapidly, which can leads to less jerkiness and artifacts in the AR-enhanced imagery displayed at the electronic device 100.

Figure 10:
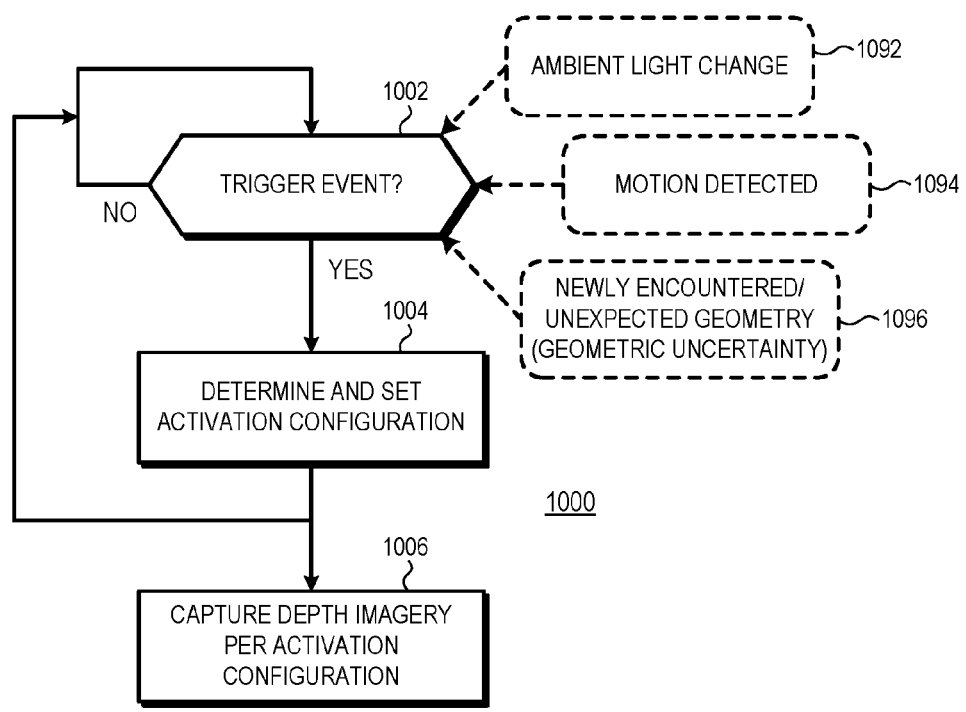
FIG. 10 is a flow diagram illustrating an operation of a modulated light-based depth sensor in accordance with at least one embodiment of the present disclosure.

FIG. 10 illustrates an example method 1000 for efficient operation of the depth sensor 120 in accordance with at least one embodiment of the present disclosure. The activation of the modulated light projector 119 of the depth sensor 120 can consume a significant amount of power. In some conventional implementations, modulated light-based depth sensors assume continuous operation and capture depth data at a frame rate of between 15-30 hertz (Hz), or a rate similar to a typical video stream. This can make the depth sensor a relatively high-powered device. In fact, the power consumed by a modulated light projector in this conventional manner can be significantly greater than the power consumed by the typical display used in a tablet, smartphone, or other portable user device.

In many instances, the amount of depth data captured in this continuous capture approach is significantly greater than the degree of depth data needed for the electronic device 100 for accurate depth analysis. Accordingly, the method 1000 illustrates a technique for selective activation of the depth sensor 120 so as to reduce or minimize the overall activation time of the depth sensor 120 while capturing sufficient depth data to permit accurate depth determinations for identified spatial features in captured imagery. In some embodiments, this selective activation can include operating the depth sensor 120 in a burst flash mode whereby a single or small, rapid sequence of depth images is captured on demand in response to one or more trigger event types. Under this approach, the overall power draw of the depth sensor 120 can be reduced, thereby extending the amount of time the electronic device 100 can operate for a given battery charge, while also reducing the thermal requirements of the electronic device 100.

For purposes of the following, an "activation configuration" controls operation of the depth sensor by specifying the frequency at which the modulated light projector 119 is activated to project a modulated light pattern and the intensity and duration for which the modulated light pattern is projected. This frequency, intensity, and duration together are analogous to a duty cycle. When the depth sensor 120 is disabled (e.g., when depth sensing is being performed via multiview image analysis), the activation configuration of the depth sensor 120 may be interpreted as a frequency, intensity, and duration of zero. Conversely, when the depth sensor 120 is enabled (e.g., when depth sensing to being performed via modulated light projection), the activation configuration of the depth sensor represents a non-zero frequency, intensity, and duration. Further, as illustrated below with reference to FIGS. 13-20, the activation configuration also can control the timing of the activation of the modulated light projector relative to the initiation/termination of the image capture process.

When modulated light-based depth sensing is being performed, the frequency of depth image capture generally is relative to the "familiarity" the electronic device 100 has with the immediate area that is being sensed. If the electronic device 100 has been stationary for a period of time, the electronic device 100 likely has had an opportunity to obtain sufficient depth data for the immediate area. As such, the electronic device 100 can decrease the frequency and light intensity of the depth image capture process. However, if the electronic device 100 is in motion, it is more likely that the electronic device 100 is encountering a previously-unencountered environment and thus the electronic device 100 will increase the frequency of depth image capture so as to more rapidly accumulate sufficient depth data for the local environment through which it is travelling.

In some instances, the electronic device 100 may be in an area for which it has previously developed sufficient depth data, but changes in the environment have since occurred and thus made the previous depth data unreliable. To illustrate, the electronic device 100 may have developed depth data for objects in a conference room the first time the user enters the conference room with the electronic device 100. Afterward, the furniture and fixtures in the conference room have been rearranged, so that the next time the user enters the conference room, the user is entering a previously-unencountered environment and thus the depth data for the conference room is stale. In some embodiments, the potential for change in the arrangement of objects in a given area can be addressed through an automatic periodic depth data recapture triggered by a lapse of a timer so as to refresh or update the depth data for the area. The electronic device 100 also can gauge its current familiarity with its immediate area by evaluating the geometric uncertainty present in imagery captured from the current area. This geometric uncertainty is reflected in, for example, the detection of previously-unencountered objects or geometry, such as a set of edges that were not present in previous imagery captured at the same or similar position/orientation, or the detection of an unexpected geometry, such as the shift in the spatial positioning of a set of corners from their previous positioning in an earlier-captured image from the same or similar device position/orientation.

To this end, in one embodiment the electronic device 100 catalogs the spatial features detected at a particular position/orientation. This catalog of features can include a list of spatial features, along with certain characteristics, such as their relative positions/orientations, their dimensions, etc. Because the local environment may change with respect to the same location (e.g., objects may be added or removed, or moved to new positions), when the electronic device 100 again returns to the same location, the electronic device 100 can determine whether it is in a previously-unencountered environment by identifying the spatial features currently observable from the location and comparing the identified spatial features with the spatial features previously cataloged for the location. If there is sufficient dissonance between the currently-encountered spatial features and the previously-encountered spatial features for the same location, the electronic device 100 concludes it is in a previously-unencountered environment and proceeds with configuring the activation configuration of the depth sensor 120 accordingly.

Thus, to initiate an adjustment to the activation configuration of the depth sensor 120, at block 1002 the 2D processor monitors for a trigger event selected to cause a reassessment of the current activation configuration of the depth sensor 120. This trigger event can include a change in the sensed ambient light that exceeds a threshold (block 1092), the detection of motion of the electronic device (or the detection of the absence of motion) (block 1094), or the detection of certain geometric uncertainty in the imagery currently being captured by the imaging cameras 114, 116, and/or 118 (block 1096). The trigger event also can include the lapse of a timer that represents a periodic refresh trigger.

In response to detecting a trigger event, at block 1004 the 2D processor 802 determines an appropriate revised activation configuration for the depth sensor 120 based on the trigger event. As an example, if the trigger event (blocks 1002, 1092) is that the sensed ambient light exceeded one threshold, the 2D processor 802 elects to switch from modulated light depth sensing to modulated light-based depth sensing, and thus activates the depth sensor 120 and initially sets the frequency, intensity, and duration of projection of a modulated light pattern to specified default values. Conversely, if the trigger event 1002, 1092 is that the sensed ambient light fell below a lower threshold, the 2D processor 802 elects to switch back to modulated light depth sensing and thus deactivates the depth sensor 120 by setting the frequency, intensity, and duration to zero. As another example, if the trigger event 1002, 1094 is that the electronic device 100 is traveling at a speed above a threshold, then the 2D processor 802 increases the frequency of modulated light flashes and corresponding reflected modulated light image captures. That is, the 2D processor 802 can enter a burst mode whereby a rapid sequence of depth image captures is conducted. Conversely, if the trigger event (blocks 1002, 1094) is that the electronic device 100 is traveling at a speed below a threshold, the 2D processor 802 decreases the frequency of modulated light flashes and corresponding reflected modulated light image captures. As a further example, the 2D processor 802 may increase or decrease the frequency of modulated light pattern projections/reflected modulated light image captures based on a comparison of an indicator of the detected geometric uncertainty to one or more thresholds (block 1096).

The current context of the electronic device 100 also may be used in determining the appropriate activation configuration. To illustrate, if the current context indicates that the user is using the electronic device 100 to provide an AR graphical overlay that is supposed to precisely identify the location of non-visible or buried objects, it may be more imperative that the electronic device 100 accurately identify the relative 3D positions of spatial features so as to accurately position the AR graphical overlay over the underlying captured image. As such, the 2D processor 802 may set the modulated light projections to the higher end of a range associated with a corresponding trigger event. However, if the current context indicates that the user is using the electronic device 100 to provide general navigational guidance via displayed directional areas, it may be less imperative to accurately identify the relative 3D positions of spatial features and thus the 2D processor 802 may set the modulated light projections to the lower end of the range associated with the corresponding trigger event.

The duration or intensity also may be revised based on the trigger event type or the current context of the electronic device 100. For example, if there is more ambient light present in the local environment, and thus more chance of interference with the modulated light pattern, the 2D processor 802 may configure the modulated light projector 119 to project the modulated light pattern at a higher intensity and for a longer duration so as to more fully energize the image sensor with the reflected modulated light pattern. As another example, the duration or intensity of the modulated light pattern also may be set based on the proximity of the electronic device 100 to an object in the field of view, or a reflectance of materials present in the field of view.

With the revised activation configuration set, at block 1006 the 2D processor 802 activates the modulated light projector 119 and captures the resulting depth images (that is, the reflected modulated light images) at a frequency specified by the activation configuration set at block 1004. In parallel, the method 1000 returns to block 1002 whereby the 2D processor 802 continues to monitor for another trigger event so as to initiate the next iteration of the depth sensor configuration process represented by method 1000.

Figure 11:
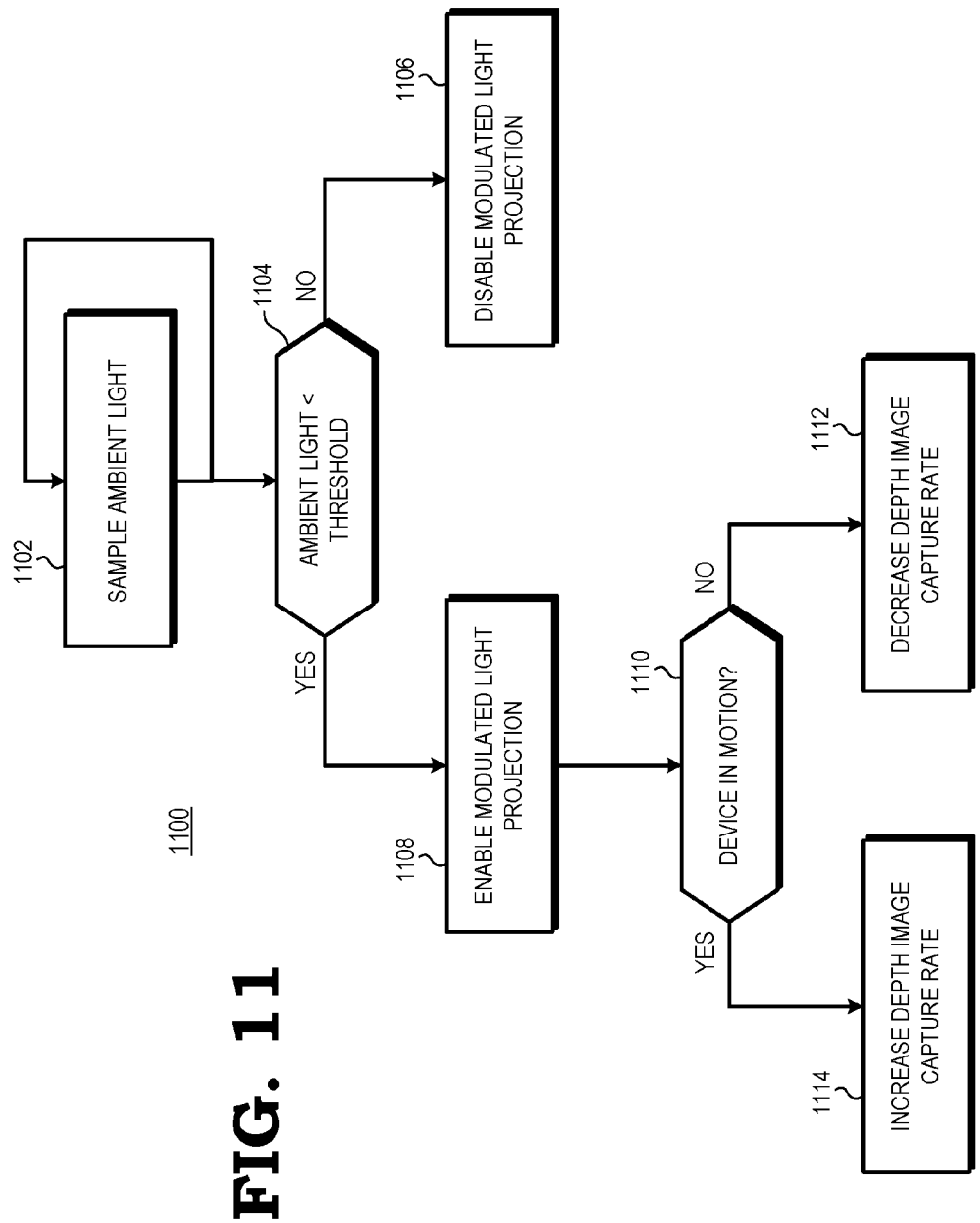
FIG. 11 is a flow diagram illustrating a method for controlling an activation configuration of a modulated light-based depth sensor in accordance with at least one embodiment of the present disclosure.

FIG. 11 illustrates a method 1100 that represents a specific example implementation of the more general method 1000 in accordance with at least one embodiment of the present disclosure. For the method 1100, the activation configuration of the depth sensor 120 is controlled based on the ambient light incident on the electronic device 100 and based on the motion of the electronic device 100. Accordingly, at block 1102 the 2D processor 802 samples the ambient light sensor 826 (FIG. 8) to obtain the current ambient light reading and at block 1104 the 2D processor 802 compares the current ambient light reading to a specified threshold. If the current ambient light reading is greater than the threshold, at block 1106 the 2D processor 802 enters a stereoscopic or other multiview depth sensing mode (or stays in the multiview depth sensing mode if already in this mode) and disables the modulated light projector 119.

If the current ambient light reading is less than the threshold, at block 1108 the 2D processor 802 enters a modulated-light depth sensing mode (or stays in this mode if it is already in this mode) and enables the modulated light projector 119. Further, if the 2D processor 802 switches to this mode from the modulated light depth sending mode, the 2D processor 802 sets the activation configuration to a default non-zero frequency, intensity, and duration. While in the modulated-light depth sensing mode, at block 1110 the 2D processor 802 monitors the accelerometer 824 to determine whether the electronic device 100 is in motion. If not in motion, at block 1112 the 2D processor 802 may decrease the depth image capture rate (and correspondingly decrease the frequency of modulated light projections) from the default rate after a specified lapse of time since motion ceased. If in motion, at block 1114 the 2D processor 802 may increase the depth image capture rate (and correspondingly increase the frequency of modulated light projections) from the default rate. Concurrently, the method 1100 returns to block 1102 whereby the 2D processor 802 captures the next ambient light reading and begins the next iteration of tuning the depth image capture rate to the current conditions encountered by the electronic device 100. Note that the sampling of the ambient light sensor 826 (block 1104) and the sampling of the accelerometer 824 (block 1110), and the processes enacted in response to the resulting sample values, may occur at the same rate or at different rates.

Figure 12:
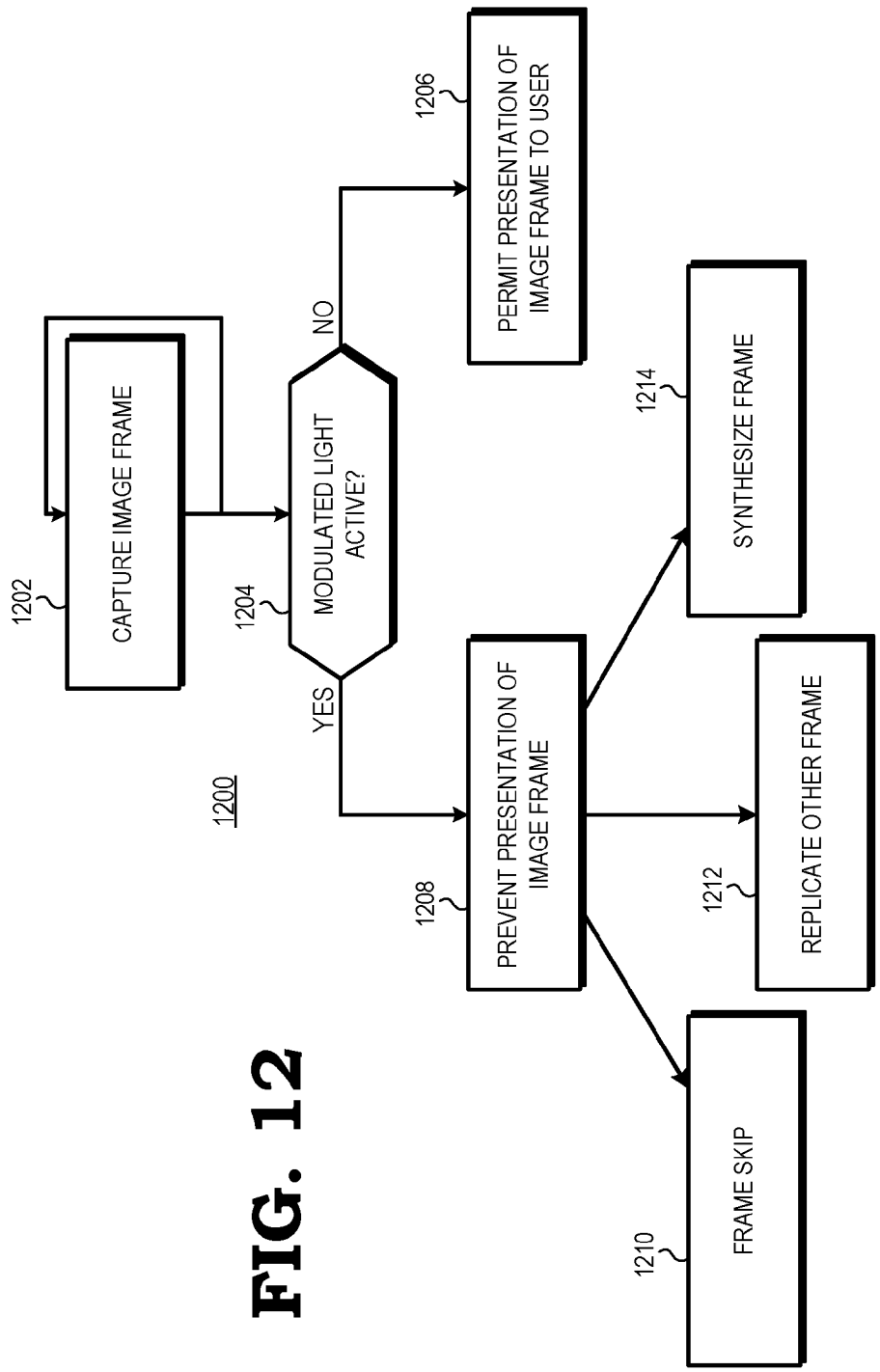
FIG. 12 is a flow diagram illustrating a method for controlling display of visible image frames based on modulated light projection in accordance with at least one embodiment of the present disclosure.

FIG. 12 illustrates an example method 1200 for visible-light image capture during modulated light-based depth sensing by the electronic device 100 in accordance with at least one embodiment. Image sensors, such as those that may be deployed in the imaging cameras 114, 116, and 118, are sensitive to a broad range of the electromagnetic spectrum, including both visible light and infrared light. Accordingly, the infrared or near-infrared modulated light pattern projected by the modulated light projector 119 can interfere with an imaging camera attempting to capture visible-light at the same time. Typically, this interference is manifested as the modulated light pattern being visible in the captured visible light imagery.

In many instances, it is not practicable to attempt to remove the modulated light pattern from the visible light imagery through post-capture image processing. Accordingly, the method 1200 represents a technique for removing corrupted image frames in reliance on the persistence of vision phenomenon that prevents a viewer from readily detecting the removed corrupted image frame or the use of a replacement image frame in its place. Thus, if the imaging camera is running at, for example, 30 frames per second (fps) or 60 fps, the electronic device 100 can flash the modulated light projector 119 for a single frame every second, and then skip the display or use of the visible-light image frame that was captured while the modulated light projector 119 was active. Alternatively, a replacement image frame can be inserted into the video feed in place of the corrupted image frame so as to provide a slightly smoother video transition. This replacement image can include a duplicate of the preceding or following image frame in the video frame sequence. The replacement image also could be an interpolated image frame that is interpolated between the preceding frame and the following frame. In another approach, a pixel warping technique could be applied to correlated depth imagery to synthesize the image content of the dropped image frame. In any event, the result would be a slight lowering of the effective frame rate to an acceptable rate of 29 or 59 fps, which would be an indiscernible change to most viewers most of the time.

To this end, an iteration of the method 1200 starts at block 1202, whereby the 2D processor 802 (FIG. 8) operates one of the imaging cameras 114 and 116 to capture a visible-light image frame. At block 1204, the 2D processor 802 determines whether the modulated light projector 119 was active at the time of the image capture, and thus likely corrupted the visible-light image frame. In one embodiment, the 2D processor 802 can implement a sliding time window such that if its control history shows that the activation of the modulated light projector 119 and the operation of the shutter in the imaging camera both occurred within this sliding time window, the 2D processor 802 can conclude that the captured visible-light image frame was corrupted. In another embodiment, the 2D processor 802 can perform an image analysis to detect whether some resemblance of the modulated light pattern is present in the visible-light image frame to determine whether the visible-light image frame was corrupted.

If the visible-light image frame is deemed to be uncorrupted, at block 1206 the 2D processor 802 permits the captured image frame to be included in the video stream presented to the user. Otherwise, if the visible-light image frame is deemed to be corrupted, at block 1208 the 2D processor 802 blocks the display or other use of the corrupted image frame. As noted, this can include simply skipping the corrupted frame entirely (block 1210), generating a replacement image frame by duplicating another image frame in the video stream (block 1212), or generating a replacement image frame by interpolating between two or more other image frames in the video stream or using alternative image content (block 1214), such as the depth imagery concurrently captured by another imaging camera, to synthesize the image content present in the corrupted image frame.

As noted above, while the modulated light pattern projections can interfere with the capture of visible-light imagery or other imagery being captured for reasons unrelated to the modulated light pattern projection. This interference can be particularly problematic when an electronic rolling shutter (ERS) image sensor is deployed as an imaging camera. In an ERS imaging camera, the pixel rows of a sensor array are activated in sequence such that the top pixel row of the sensor array starts exposing before the next row, and so forth. When a specified exposure time is reached, the top pixel row is read out while the other rows are still being exposed. This process then continues to the next pixel row after it has been exposed for the specified exposure time, and so forth. This process can lead to a situation whereby the top pixel rows are being exposed to capture image data for a next image frame while the bottom pixel rows are still exposed for capturing image data of the previous image frame. Accordingly, projection of a modulated light pattern during this time interval would have the result of potentially interfering with the image data captured for two or three adjacent image frames. FIGS. 13-20 below illustrate techniques for controlling modulated light pattern projections, or "modulated light flashes," in conjunction with the use of an ERS imaging camera for depth imagery capture so as to reduce or eliminate this dual-image interference and other projected modulated light interference.

Figure 13:
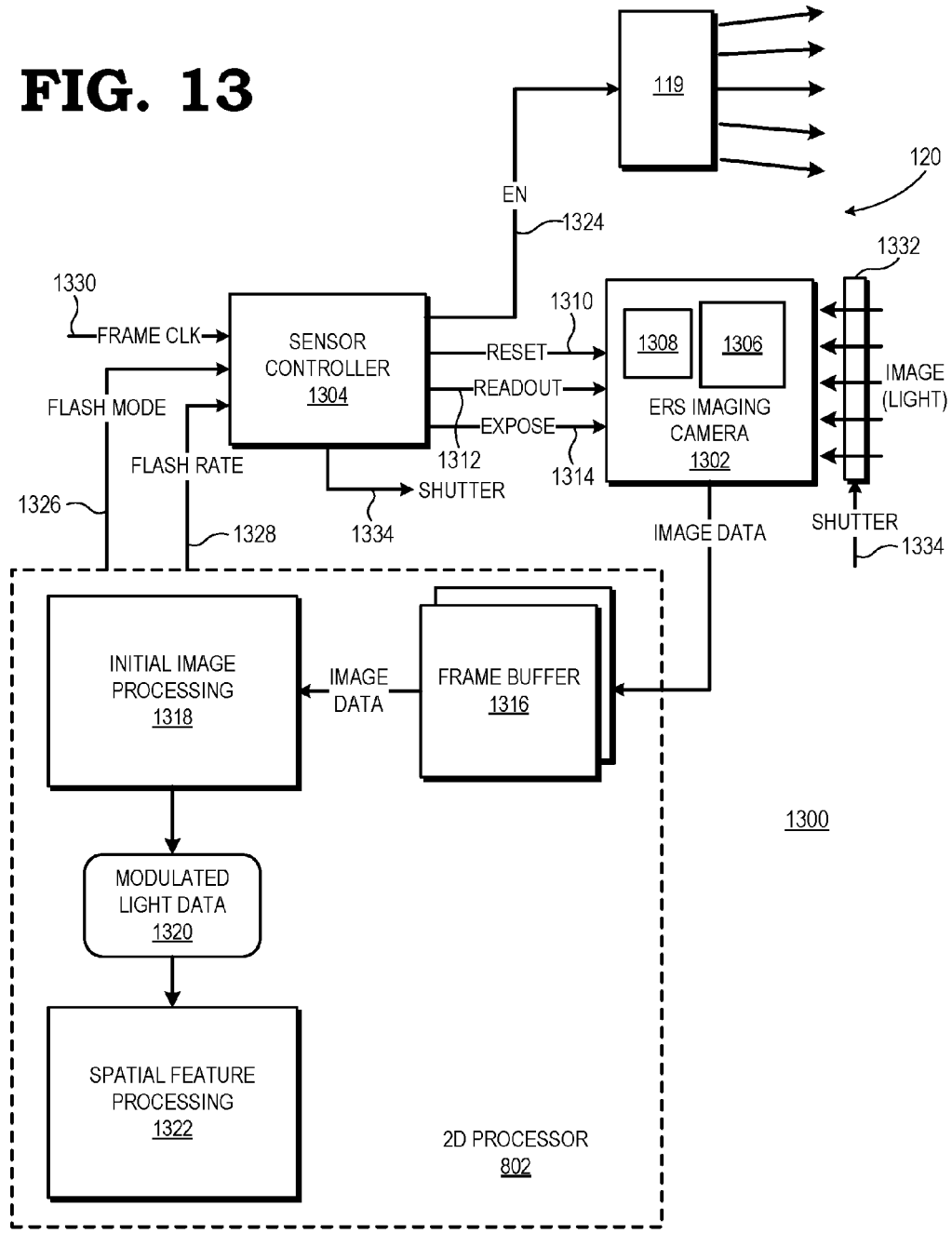
FIG. 13 is a block diagram illustrating an imaging subsystem implementing modulated light flash control with an electronic rolling shutter imaging camera in accordance with at least one embodiment of the present disclosure.

FIG. 13 illustrates an imaging subsystem 1300 for modulated light flash control with an electronic rolling shutter imaging camera in accordance with at least one embodiment of the present disclosure. The imaging subsystem 1300 may be implemented as, for example, a subsystem of the processing system 800 (FIG. 8), and thus may include the 2D processor 802 and the depth sensor 120, as described above. The depth sensor 120 includes the modulated light projector 119 and an ERS imaging camera 1302, which represents a rolling-shutter-based implementation of one or more of the imaging cameras 114, 116, and 118 (FIG. 8). The imaging subsystem 1300 further includes a sensor controller 1304 to control operation of the modulated light projector 119 and the ERS imaging camera 1302. In the depicted example, the sensor controller 1304 is implemented as a hardware device separate from the 2D processor 802. In other examples, the sensor controller 1304 may be partially or wholly implemented by the 2D processor 802, and the software executed thereon.

The ERS imaging camera 1302 comprises a sensor array 1306 and array control logic 1308. The sensor array 1306 includes a set of pixel rows (not shown), each pixel row comprising circuitry to gather light for a corresponding row of pixels in the form of accumulated charge, with the accumulated charge captured at each pixel "position" in the pixel row representing the "image data" or "image content" for the pixel position within that pixel row for a corresponding image frame. The array control logic 1308 controls the activation, termination, and readout of the image data from each pixel row responsive to various control signaling received from the sensor controller 1304, including reset signaling 1310, readout signaling 1312, and expose signaling 1314 (denoted in FIG. 13 as "RESET", "READOUT", and "EXPOSE", respectively). In response to assertion of the reset signaling 1310, the array control logic 1308 affects a "global reset" of the sensor array 1306, in which the circuitry of all of the pixel rows of the sensor array 1306 is reset, thus clearing any accumulated charge present in the sensor array 1306. In response to an assertion of the expose signaling 1314, the array control logic 1308 initiates the rolling shutter process of activating each pixel row in sequence for exposure so as to begin the capture of image data for a corresponding image frame. Typically, the pixel row sequence is proceeds from the top pixel row to the bottom pixel row ("top" and "bottom" being relative), but this order may be reversed in some implementations. In response to an assertion of the readout signaling 1312, the array control logic 1308 initiates the process of terminating exposure of each pixel row in the same sequence as the activation for exposure and reads out the image data from the sensor array 1306 from each pixel row in sequence.

Image data for an image frame captured by the ERS imaging camera 1302 is buffered in a frame buffer 1316, which may have the capacity to store multiple image frames. Although illustrated as part of the 2D processor 802, the frame buffer 1316 alternatively may be implemented in memory separate from the 2D processor 802. An initial image processing module 1318 then obtains the image data from the frame buffer 316 for initial processing. As described below, this initial image processing can include, for example, extraction of modulated light data 1320 from the image data, where the modulated light data 1320 represents an image captured by the ERS imaging camera 1302 primarily from the reflections of a projected modulated light pattern, or "modulated light flash", from the modulated light projector 119. The modulated light data 1320 then may be processed by a spatial feature processing module 1322 of the 2D processor 802 for detection of spatial features and corresponding depth data from the modulated light data 1320 using the techniques described above.

In some embodiments, in addition to its role in capturing reflected modulated light patterns as part of the depth sensor 120, the ERS imaging camera 1302 also serves as an imaging camera for capturing a stream of visible-light images that is used, for example, in SLAM processes or for AR display to a user. In order to reduce or eliminate interference in this imagery due to modulated light flash, the sensor controller 1304 and the 2D processor 802 operate to control the timing, rate, and duration of the modulated light flashes projected by the modulated light projector 119, as well as to control the operation of the ERS imaging camera 1302 with respect to the projected modulated light flashes. To this end, the sensor controller 1304 includes outputs to provide the reset signaling 1310, the readout signaling 1312, and the expose signaling 1314 for the ERS imaging camera 1302, as well as an output to provide enable signaling 1324 (denoted "EN" in FIG. 13) to control the modulated light projector 119. The sensor controller 1304 further includes inputs to receive flash mode signaling 1326, flash rate signaling 1328, and frame clock signaling 1330 (denoted, "FLASH MODE", "FLASH RATE", and "FRAME CLK", respectively, in FIG. 13), which may originate from the 2D processor 802 or other component of the processing system 800.

The flash rate signaling 1328 sets the rate at which depth image frames are captured by the ERS imaging camera 1302 (that is, the rate at which modulated light flashes are projected by the modulated light projector 119 and corresponding modulated light image frames are captured by the ERS imaging camera 1302). This rate typically is represented as relative to a corresponding total number of image frames captured by the ERS imaging camera 1302. For example, the imaging subsystem 1300 may interleave depth image capture with non-depth image capture, such that one depth image is captured every N image frames captured by the ERS imaging camera 1302. As described above, this rate of depth image capture may be relative to the "familiarity" the electronic device 100 has with the immediate area, with the flash rate increasing the less "familiar" the electronic device 100 is with the immediate area. To this end, the sensor controller 1304 uses the frame clock signaling 1330, which represents the overall image capture frame rate of the ERS imaging camera 1302 (e.g., 30 Hz or 60 Hz) to provide reference timing for the activation and termination of the modulated light projector 119 relative to an image frame capture period (that is, to select which particular image frames in a sequence of image frames are to be depth imagery).

Fine tuning of the timing of the modulated light flash within the capture period for an image frame selected to be used for depth imagery is then dictated by the particular flash mode signaled via the flash mode signaling 1326. In some embodiments, the sensor controller 1304 can implement any of a plurality of flash modes, which can include, for example, a "a burst flash" mode, a "non-shuttered frame exposure (FREX)" mode, or a "shuttered FREX" mode, the details of which are described below with reference to FIGS. 14-20. In each of these flash modes, the sensor controller 1304 times modulated light flashes so that the duration of each modulated light flash is constrained to only that portion of the image frame capture whereby all activated pixel rows of the sensor array 1306 are capturing image data for the same image frame. That is, the modulated light flash for an image frame initiates while each pixel row of the set of pixel rows is exposed for gathering light for the same image frame and terminates before any pixel row of the set is exposed for gathering light for the next image frame. In this way, a modulated light flash is limited to potential interference with only one image frame being captured by the ERS imaging camera 1302.

Some implementations of the ERS imaging camera 1302 may implement a global reset feature enacted through assertion of the reset signaling 1310. This global reset feature permits the substantially simultaneous initiation of exposure for all of the pixel rows of the sensor array 1306, rather than on a row-by-row basis as typically implemented in an ERS imaging camera. In some embodiments, one or more of the flash modes available to the sensor controller 1304 also may incorporate a frame exposure (FREX) mode that utilizes this global reset feature to expose all of the pixel rows of the sensor array 1306 substantially simultaneously while capturing a modulated light image frame. In doing so, the amount of charge collected at the pixel rows due to ambient light may be reduced or minimized, thereby leading to a higher signal-to-noise ratio (SNR) for the resulting captured depth image frame. In this context, the SNR refers to the ratio of collected charge representing reflected modulated light to collected charge representing ambient light, or non-modulated light, for each pixel circuit within the sensor array 1306. The use of the global reset feature also can reduce motion blur and other effects common to rolling shutter cameras.

Further, in some embodiments, the imaging subsystem 1300 may employ a mechanical shutter 1332, which can be activated by the sensor controller 1304 through assertion of shutter signaling 1334 (denoted "SHUTTER" in FIG. 13) so as to terminate exposure of all of the pixel rows of the sensor array 1306 substantially simultaneously. One or more of the flash modes may employ the mechanical shutter in this way during depth image capture so as to globally terminate exposure of the pixel rows of the sensor array 1306 after termination of a modulated light flash, and thus reduce the amount of charge collected at the pixel rows due to ambient light after the modulated light flash terminates. As with the FREX mode, this can facilitate a higher SNR for a captured depth image.

Figure 14:
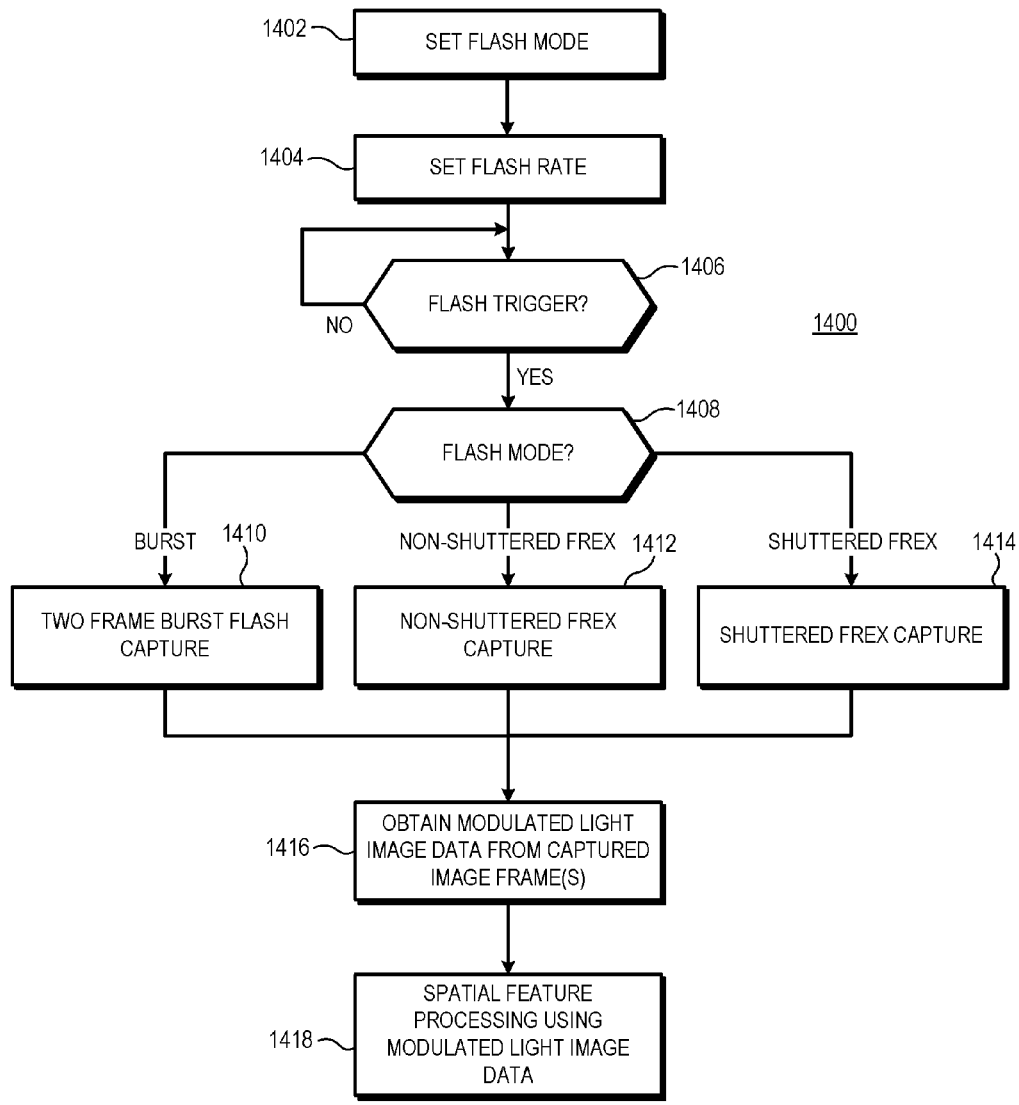
FIG. 14 is a flow diagram illustrating a method for modulated light flash control during image frame capture by an electronic rolling shutter imaging camera in accordance with at least one embodiment of the present disclosure.

FIG. 14 illustrates an example method 1400 of operation of the imaging subsystem 1300 of FIG. 13 for depth image capture in accordance with at least one embodiment of the present disclosure. The method 1400 initiates at block 1402 with the 2D processor 802 setting the flash mode to be implemented by the sensor controller 1304. In some embodiments, the sensor controller 1304 may be capable of implementing multiple flash modes, and the 2D processor 802 selects between the flash modes based on various considerations, such as expected power consumption, ambient conditions, current usage of the electronic device 100, and the like. To illustrate, if the ERS imaging camera 1302 is already capturing image frames at a nominal frame rate at or near its maximum frame capture rate, the 2D processor 802 may elect to implement a flash mode other than the burst flash mode since, as described below, this mode relies on increasing the frame rate above the nominal frame rate. In other embodiments, the sensor controller 1304 may be limited in the flash modes it can implement or implement only a single flash mode. For example, the electronic device 100 may not employ the mechanical shutter 1332 and thus cannot implement a flash mode that relies on use of a mechanical shutter, or the ERS imaging camera 1302 may not have the global reset feature and thus may be limited to non-FREX flash modes. After selecting a flash mode, the 2D processor 802 configures the sensor controller 1304 via the flash mode signaling 1326 to implement the selected flash mode.

At block 1404, the 2D processor 802 configures the sensor controller 1304 via the flash rate signaling 1324 to implement an identified flash rate, which reflects the depth image capture rate. This flash rate, in some embodiments, is adjustable depending on various conditions. To illustrate, in an area with a higher level of ambient light, modulated-light-based depth sensing may be less effective than other depth sensing mechanisms, and thus the 2D processor 802 may implement a lower flash rate in high ambient light conditions (or turn off depth image capture completely). As another example, in an unfamiliar area the electronic device 100 may elect to increase the depth image capture rate (and thus increase the flash rate) so as to more rapidly gain an understanding of the positions of spatial features in the area.

With the flash rate set, at block 1406 the sensor controller 1304 configures a decrementing counter or other mechanism to time the duration (in captured image frames) between depth image captures. To illustrate, if the frame rate is set to one depth frame for every 30 captured frames, the decrementing counter can be set to 29 and then decrement with each cycle of the frame clock signaling 1330. When the decrementing counter reaches zero, the sensor controller 1304 is triggered to treat the next image frame to be captured as a depth image using a modulated light flash projected from the modulated light projector 119.

In response to this flash trigger, at block 1408 the sensor controller 1304 determines its flash mode setting and prepares to control the operation of the modulated light projector 119 and the ERS imaging camera 1302 in accordance with this flash mode setting. In the event that the sensor controller 1304 is configured for a burst flash mode, at block 1410 the sensor controller 1304 controls the modulated light projector 119 and the ERS imaging camera 1302 in accordance with a burst flash capture technique described below with reference to FIGS. 15 and 16. In the event that the sensor controller 1304 is configured for a non-shuttered FREX mode, at block 1412 the sensor controller 1304 controls the modulated light projector 119 and the ERS imaging camera 1302 in accordance with a non-shuttered FREX flash mode capture technique described below with reference to FIGS. 17 and 18. In the event that the sensor controller 1304 is configured for a shuttered FREX mode, at block 1414 the sensor controller 1304 controls the modulated light projector 119 and the ERS imaging camera 1302 in accordance with a shuttered FREX mode capture technique described below with reference to FIGS. 19 and 20.

After completing the depth image capture process represented by one of blocks 1410, 1412, or 1414, the resulting captured image data is provided to the 2D processor 802. At block 1416, the 2D processor 802 processes the captured image data to obtain modulated light image data representing the reflected modulated light flash as captured by the ERS imaging camera 1302. This processing can include, for example, various forms of filtering the image data to increase SNR or otherwise facilitate spatial feature detection and depth calculation. Further, in some embodiments, this processing can include comparison (e.g., subtraction) of the image content of an adjacent image frame (i.e., an image frame captured before or after the subject modulated light image frame) with the captured image data so as to substantially remove the non-modulated light image content from the resulting modulated light image data, as described in greater detail below. At block 1418, the modulated light image data is processed by the 2D processor 802 to determine a depth map or other depth information for spatial features identified in the captured image frame using any of a variety of depth sensing techniques, as described above.

Figure 15:
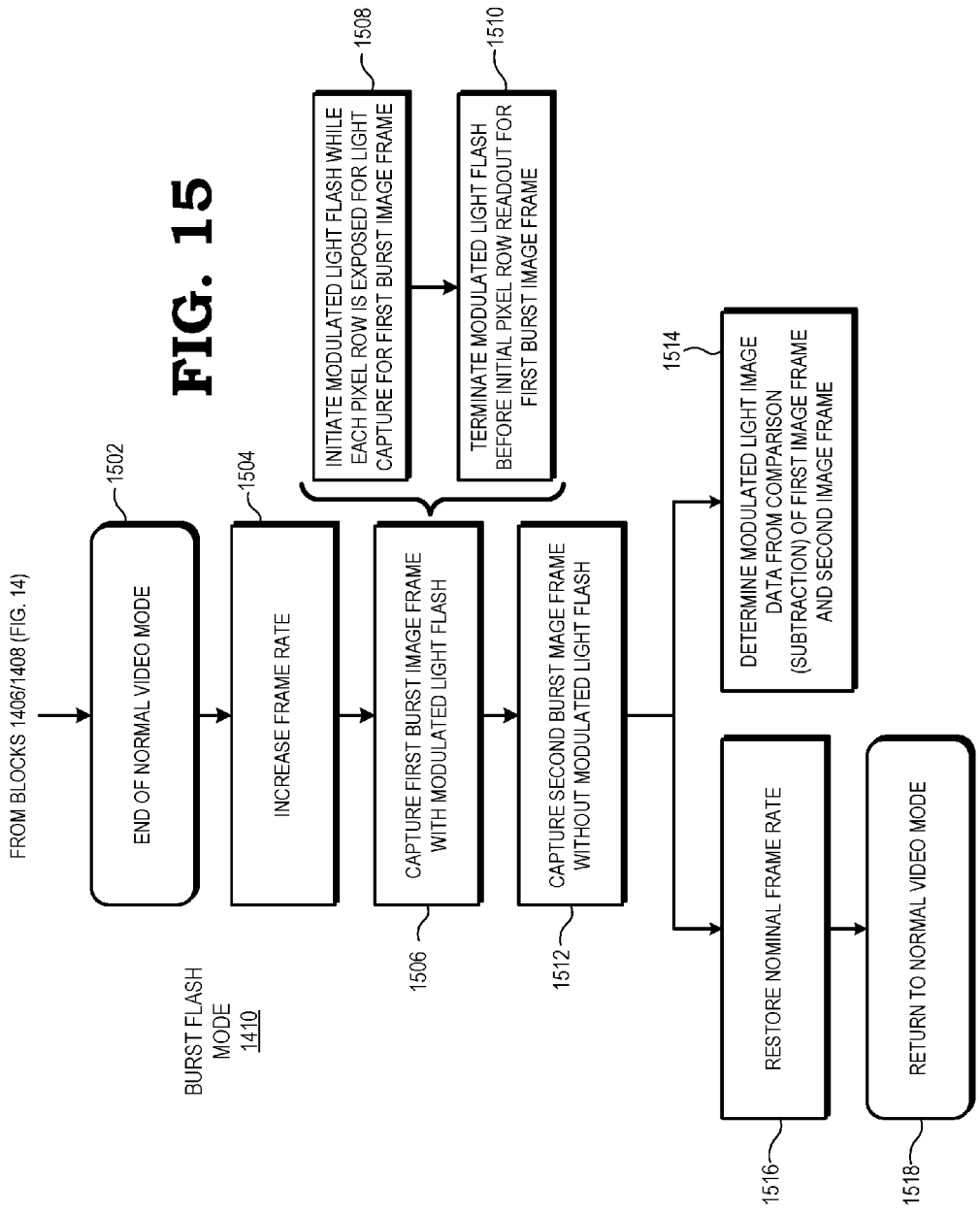
FIG. 15 is a flow diagram illustrating a method for a burst flash mode for modulated light flash control in accordance with at least one embodiment of the present disclosure.

FIG. 15 illustrates an example process for implementing the burst flash mode of block 1410 of FIG. 14 for depth imagery capture in accordance with at least one embodiment of the present disclosure. For ease of illustration, this process is described in the example context of the image subsystem 1300 of FIG. 13. As described above, while in a normal video mode the ERS imaging camera 1302 captures a stream of image frames at a nominal frame rate indicated by the frame clock signaling 1330, and this stream of image frames may be used for AR display to a user, SLAM processing, and the like. While in a depth sensing mode using modulated light projection, the sensor controller 1304 is configured to capture a depth image every N frames of the stream of image frames by projecting a modulated light flash every Nth frame and capturing the reflected modulated light as the Nth frame. Accordingly, when a decrementing counter or other mechanism signals the start of an Nth frame at block 1406 (FIG. 14) and the flash mode is identified as the burst flash mode at block 1408, the process of block 1410 commences. Accordingly, at block 1502 the sensor controller 1304 switches modes from the normal video mode using the nominal frame rate to the burst flash mode using an increased frame rate.

In response to entering the burst flash mode, at block 1504 the sensor controller 1304 enters a burst capture mode by increasing the frame clock using a phase locked loop (PLL) or other clock multiplier to generate an accelerated frame rate. For purposes of illustration, the burst flash mode is described in the context of a two-frame burst, and thus the frame rate is doubled. However, in other embodiments, more than two frames may be captured in this burst flash mode, and the frame rate multiplied accordingly (e.g., tripling the frame rate to capture a three frame burst, etc.).

At block 1506 the sensor controller 1304 controls the ERS imaging camera 1302 to capture a first burst image frame at the accelerated frame rate. Concurrently, the sensor controller 1304 controls the modulated light projector 119 to project a modulated light flash during the capture of this first burst image frame. Because the ERS imaging camera 1302 implements a rolling shutter, the sensor controller 1304 controls the timing of the modulated light flash so as to avoid interference with the capture of an adjacent image frame. Accordingly, as illustrated by sub-block 1508, the sensor controller 1304 times the initiation of the modulated light flash to occur when each pixel row of the sensor array 1306 is exposed for light capture for only the first burst image frame. When it is time to initiate the modulated light flash, the sensor controller 1304 asserts the enable signaling 1324, thereby causing the modulated light projector 119 to begin projection of the modulated light pattern. At sub-block 1510, the sensor controller 1304 times the termination of the modulated light flash to occur before the initial pixel row of the sensor array 1306 is read out. As such, the duration of the modulated flash occurs only while all pixel rows of the sensor array 1306 are activated for charge collection for the first burst image frame only. In this way, the sensor controller 1304 refrains from projecting modulated light flash during an adjacent frame (that is, while some of the top rows have begun to collect charge for the next image frame or some of the bottom rows are still collecting charge for the previous image frame).

After capturing the first burst image frame with the controlled modulated light flash, at block 1512 the sensor controller 1304 disables the modulated light projector 119 and controls the ERS imaging camera 1302 to capture a second burst image frame at the accelerated frame rate. As the modulated light projector 119 is disabled to refrain from modulated light projection during the second burst image frame capture and the modulated light flash for the first burst image frame was tightly controlled to avoid interference with an adjacent image frame, the second burst image frame is substantially or entirely devoid of modulated light interference. The second burst image frame therefore may be provided for display as part of an AR display or used for spatial feature detection as with the image frames captured during normal video mode. However, due to the shortened exposure time caused by the accelerated frame rate, the second burst image will have a lower resolution compared to image frames captured at the nominal frame rate.

Because the first burst image frame contains both reflected modulated light content and non-modulated, or ambient, light content, it may be advantageous to further process the first burst image frame to reduce or eliminate the non-modulated light content. Noting that the first and second burst image frames typically will have very similar non-modulated light content due to their adjacency, the second burst image frame can be compared with the first burst image frame to identify the non-modulated light content for removal. In one embodiment, this comparison and removal is performed through subtraction of image content. Accordingly, at block 1514 the 2D processor 802 subtracts the image content of the second burst image frame from the image content of the first burst image frame, thereby effectively removing the non-modulated light content from the first burst image frame, and stores the resulting image data as a depth image containing primarily modulated light image data. This depth image then may be processed for feature detection or depth sensing purposes using the techniques described above. Although FIG. 14 illustrates one implementation whereby the first burst image frame is used to capture the reflection of a modulated light flash, in other embodiments, the modulated light flash is timed to occur during the second burst image frame, rather than the first burst image frame, and in such instances the image content of the first burst image frame is subtracted from the second burst image frame to obtain the depth image. Moreover, in other embodiments, more than two burst image frames may be captured in sequence (with the attendant increase in frame rate relative to the nominal frame rate).

With the capture of the second burst image frame, the sensor controller 1304 completes the current iteration of the burst flash mode, and thus at block 1516 the sensor controller 1304 restores the frame capture rate of the ERS imaging camera 1302 back to the nominal frame rate and at block 1518 the sensor controller 1304 returns to the normal video mode for capturing non-modulated light image frames at the nominal frame rate for the stream of image frames output from the ERS imaging camera 1302.

Figure 16:
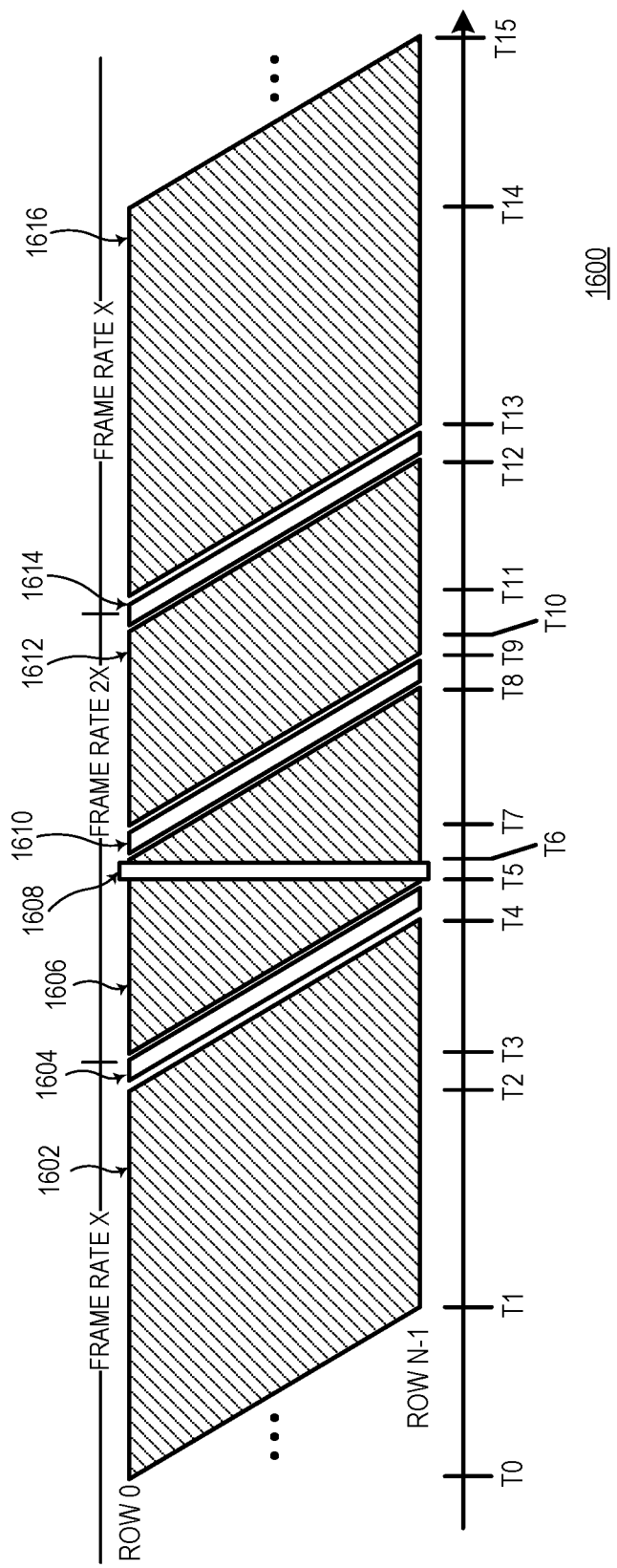
FIG. 16 is a diagram illustrating an example of the burst flash mode of FIG. 15 in accordance with at least one embodiment of the present disclosure.

FIG. 16 illustrates an example implementation of the burst flash mode of FIG. 15 in accordance with some embodiments. For ease of illustrating, this example is described in the context of the imaging subsystem 1300 of FIG. 13. In the depicted chart 1600, the horizontal axis represents time (starting at a time T0) and the horizontal axis represents the pixel rows of the sensor array 1306 (FIG. 13), with the top pixel row being identified as row 0 and the bottom pixel row being identified as row N–1. The shaded regions represent the periods of activation of the corresponding pixel rows, and the unshaded diagonal bars represent periods of pixel row read out following the exposure of the pixel rows for an image frame.

Initially, the sensor controller 1304 is operating in the normal video mode with a nominal frame rate X. At time T0, the sensor controller 1304 begins the image capture process for a normal image frame 1602 by asserting the expose signaling 1314, which in turn causes the ERS imaging camera 1302 to sequentially activate the pixel rows of the sensor array 1306 for exposure until the bottom pixel row is activated at time T1. At time T2 the ERS imaging camera 1302 terminates activation of the top pixel row and sequentially deactivates the other pixel rows of the sensor array 1306 until exposure of the bottom pixel row is terminated at time T4. After exposure of each pixel row is terminated, the array control logic 1308 reads out the pixel values from that pixel row, as illustrated by readout region 1604, to obtain the image data for the normal image frame 1602.

Sometime during the image capture process for the normal image frame 1602, the sensor controller 1304 is triggered to enter the burst flash mode so as to obtain a depth image for spatial feature processing. Accordingly, at time T3, the sensor controller 1304 doubles the frame rate from the nominal frame rate X to an accelerated frame rate 2× and begins the process of capturing the first burst image frame (denoted as first burst image frame 1606 in FIG. 16). As the ERS imaging camera 1302 has a rolling shutter, the ERS imaging camera 1302 can initiate capture of the first burst image frame 1606 at the top pixel rows while simultaneously completing the capture of the preceding normal image frame 1602 at the bottom pixel rows. To this end, after read out of the top pixel row ends for the normal image frame 1602, at time T3 the ERS imaging camera 1302 initiates exposure of the top pixel row for the first burst image frame 1606 and then sequentially activates the other pixel rows of the sensor array 1306 until the bottom pixel row is activated at time T5. Once all of the pixel rows have been activated (by time T5), the sensor controller 1304 can initiate a modulated light flash 1608. The sensor controller 1304 maintains the projection of the modulated light pattern until it is time to terminate exposure of the top pixel row at time T6. As such, the modulated light flash 1608 has a duration extending from time T5 to time T6. The ERS imaging camera 1302 then sequentially deactivates the other pixel rows of the sensor array until exposure is terminated for the bottom pixel row at time T8. After exposure of each pixel row is terminated, the array control logic 1308 reads out the pixel values from that pixel row, as illustrated by readout region 1610, to obtain the image data for the first burst image frame 1606.

While the bottom pixel rows are completing their charge collection for the first burst image frame 1606, the ERS imaging camera 1302 can initiate capture of the second burst image frame (denoted as second burst image frame 1612 in FIG. 16). Accordingly, after read out of the top pixel row ends for the first burst image frame 1606, at time T7 the ERS imaging camera 1302 initiates exposure of the top pixel row for the second burst image frame 1612 and then sequentially activates the other pixel rows of the sensor array 1306 until the bottom pixel row is activated at time T9. At time T10 the ERS imaging camera 1302 terminates exposure of the top pixel row and sequentially deactivates the other pixel rows of the sensor array 1306 until exposure of the bottom pixel row is terminated at time T12. After exposure of each pixel row is terminated, the array control logic 1308 reads out the pixel values from that pixel row, as illustrated by readout region 1614, to obtain the image data for the second burst image frame 1612.

With the burst flash completed, the sensor controller 1304 returns to the normal video mode at time T11 and thus reverts back to the nominal frame rate X. Accordingly, while the bottom pixel rows are completing their charge collection for the second burst image frame 1612, the ERS imaging camera 1302 can initiate capture of a normal image frame 1616 by initiating exposure of the top pixel row for the normal image frame 1616 at time T11 and then sequentially activating the other pixel rows of the sensor array 1306 until the bottom pixel row is activated at time T13. At time T14 the ERS imaging camera 1302 terminates exposure of the top pixel row and sequentially deactivates the other pixel rows of the sensor array 1306 until exposure of the bottom pixel row is terminated at time T15. After exposure of each pixel row is terminated, the array control logic 1308 reads out the pixel values from that pixel row to obtain the image data for the normal image frame 1616.

As illustrated by this example, the modulated light flash 1608 is restrained to a period whereby all pixel rows of the sensor array 1306 are activated for the same image frame (i.e., the first burst image frame 1606). Thus, the modulated light flash 1608 should not interfere with the capture of preceding normal image frame 1602 or the following second burst image frame 1612, even though the rolling shutter of the ERS imaging camera 1302 allows the image capture of the first burst image frame 1606 to overlap both of these other image frames. Moreover, because the frame rate is doubled, the capture of the first burst image frame 1606 for use as a depth image does not materially impact the effective frame rate as presented to a viewer, as the second burst image frame 1612 may be displayed in place of the normal image frame that otherwise would have been captured in the time slot in which both the first burst image frame 1606 and the second burst image frame 1612 were captured.

Figure 17:
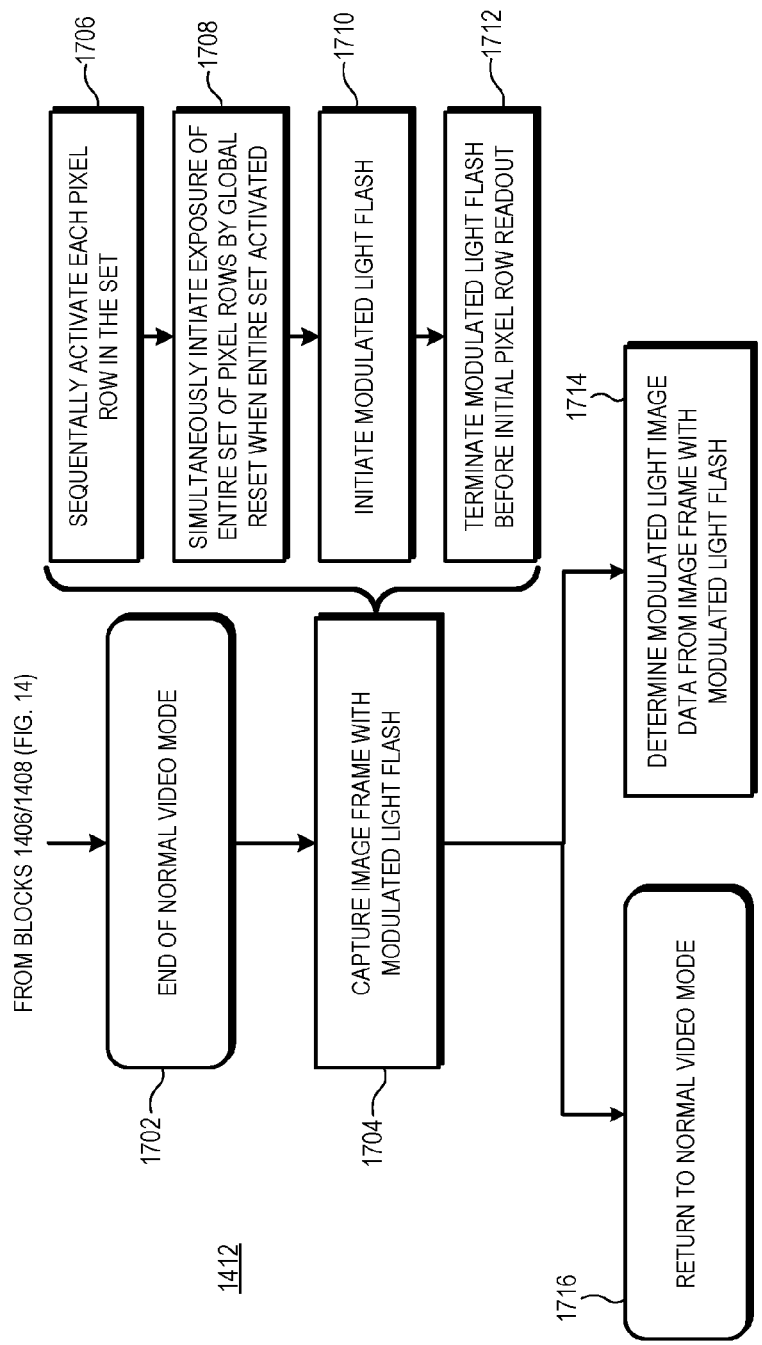
FIG. 17 is a flow diagram illustrating a method for a non-shuttered frame exposure (FREX) flash mode for modulated light flash control in accordance with at least one embodiment of the present disclosure.

FIG. 17 illustrates an example process for implementing the non-shuttered FREX flash mode of block 1412 of FIG. 14 for depth imagery capture in accordance with at least one embodiment of the present disclosure. For ease of illustration, this process is described in the example context of the image subsystem 1300 of FIG. 13. The depicted process is triggered when a decrementing counter or other mechanism signals the start of an Nth frame at block 1406 (FIG. 14) and the flash mode is identified as the non-shuttered FREX flash mode at block 1408. Accordingly, at block 1702 the sensor controller 1304 switches modes from the normal video mode to the non-shuttered FREX flash mode.

At block 1704, the sensor controller 1304 controls the ERS imaging camera 1302 and the modulated light projector 119 to project a modulated light flash during the next image frame capture so as to capture a depth image containing the reflection of the modulated light flash. To begin the depth image capture process, at sub-block 1706 the ERS imaging camera 1302 sequentially activates each pixel row for exposure from the top pixel row to the bottom pixel row. However, because of sequential row activation of the normal rolling shutter operation of the ERS imaging camera 1302, the top rows of the sensor array 1306 would otherwise have accumulated more charge due to ambient light than the bottom rows at the point that the modulated light flash is initiated. This imbalance can negatively impact accurate depth calculation or spatial feature detection. In the non-shuttered FREX flash mode, the sensor controller 1304 leverages the global reset feature of the ERS imaging camera 1302 to counteract this imbalance. Before initiating the modulated light flash for the image frame being captured, at sub-block 1708 the sensor controller 1304 asserts the reset signaling 1310, thereby triggering a global reset of all of the pixel rows of the sensor array 1306. This global reset causes the pixel circuitry of each pixel row to clear any accumulated charge and then activate every pixel row for exposure substantially simultaneously. Accordingly, any ambient light information accumulated in the pixel rows before the start of the modulated light flash is cleared from the sensor array 1306.

With the sensor array 1306 thus cleared, at sub-block 1710 the sensor controller 1304 initiates the projection of a modulated light flash by the modulated light projector 119 by asserting the enable signaling 1324. In accordance with the rolling shutter operation of the ERS imaging camera 1302, termination of exposure of the pixel rows occurs sequentially from the top pixel row to the bottom pixel row, with the pixel data of each pixel row being read out after its deactivation. Accordingly, at sub-block 1712 the sensor controller 1304 terminates the modulated light flash by deasserting the enable signaling 1324 before the top pixel row of the sensor array 1306 is deactivated for read out. As with the other implementations outlined above, this confinement of the duration of the modulated light flash to only that period in which all pixel rows are activated for the same image frame reduces or eliminates modulated light interference in adjacent image frames.

At block 1714, the 2D processor 802 receives the image data for the captured image frame from the ERS imaging camera 1302 and extracts the modulated light image data from the captured image frame. In some embodiments, this extraction process can include, for example, subtracting the image content of an adjacent frame from the captured image frame, and thus substantially removing image content resulting from ambient light. In other embodiments, due to the global reset operation, the SNR of modulated light content to ambient light content is sufficiently high due to permit effective processing for feature depth detection without further filtering or other processing. With the depth image captured, at block 1716 the sensor controller 1304 returns to the normal video mode to for capturing ambient-light-based image frames.

Figure 18:
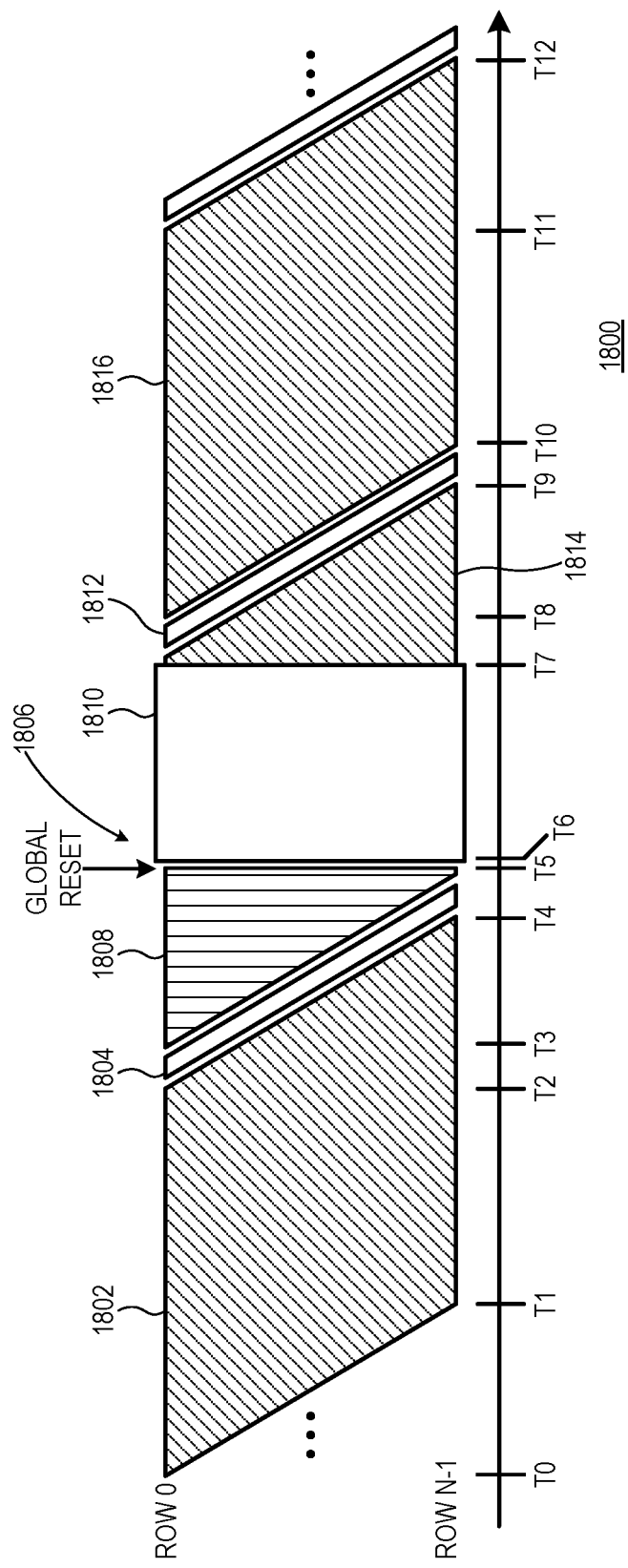
FIG. 18 is a diagram illustrating an example of the non-shuttered FREX flash mode of FIG. 17 in accordance with at least one embodiment of the present disclosure.

FIG. 18 illustrates an example implementation of the non-shuttered FREX flash mode of FIG. 17 in accordance with some embodiments. For ease of illustration, this process is described in the example context of the image subsystem 1300 of FIG. 13. In the depicted chart 1800, the horizontal axis represents time (starting at a time T0) and the horizontal axis represents the pixel rows of the sensor array 1306 (FIG. 13), with the top pixel row being identified as row 0 and the bottom pixel row being identified as row N−1. The diagonally shaded regions represent the periods of activation of the corresponding pixel rows, and the unshaded diagonal bars represent periods of pixel row read out following the exposure of the pixel rows for an image frame.

Initially, the sensor controller 1304 is operating in the normal video mode and thus initiates the capture of a normal image frame 1802 at time T0. In response, the ERS imaging camera 1302 sequentially activates the pixel rows of the sensor array 1306 for exposure from the top pixel row until the bottom pixel row is activated at time T1. The activated pixel rows accumulate charge due to ambient light incident on the sensor array 1306. At time T2, the ERS imaging camera 1302 sequentially deactivates the pixel rows until the bottom pixel row is deactivated at time T4. After exposure of each pixel row is terminated, the array control logic 1308 reads out the pixel values from that pixel row, as illustrated by readout region 1804, to obtain the image data for the normal image frame 1802.

While the bottom pixel rows are completing their charge collection for the normal image frame 1802, the ERS imaging camera 1302 can initiate capture of an image frame 1806, referred to as "FREX image frame 1806". Accordingly, after read out of the top pixel row ends for the normal image frame 1802, at time T3 the ERS imaging camera 1302 initiates exposure of the top pixel row for the FREX image frame 1806 and then sequentially activates the other pixel rows of the sensor array 1306 until the bottom pixel row is activated at time T5.

At time T5 all pixel rows of the sensor array 1306 are activated to collect charge for the FREX image frame 1806. However, the pixel rows have been activated for different amounts of time and thus have accumulated different amounts of charge related to their duration of activation. For example, by time T5 the top pixel row has been active for the duration from time T3 to time T5, whereas the bottom pixel row has just been activated at time T5. To clear this imbalance, following the activation of all pixel rows at time T5, the sensor controller 1304 asserts the reset signaling 1310 to trigger a global reset of the sensor array 1306, which clears the pixel rows of all of the accumulated charge represented by the vertically striped region 1808 in the chart 1800.

Shortly thereafter, at time T6 the sensor controller 1304 initiates a modulated light flash 1810 by asserting the enable signaling 1324 for the modulated light projector 119. The sensor controller 1304 maintains the projection of the modulated light pattern until it is time to terminate exposure of the top pixel row at time T7. As such, the modulated light flash 1810 has a duration extending from time T6 to time T7. The ERS imaging camera 1302 then sequentially deactivates the other pixel rows of the sensor array until exposure is terminated for the bottom pixel row at time T9. After exposure of each pixel row is terminated, the array control logic 1308 reads out the pixel values from that pixel row, as illustrated by readout region 1812, to obtain the image data for the FREX image frame 1806.

With the non-shuttered FREX flash completed, the sensor controller 1304 returns to the normal video mode. Accordingly, while the bottom pixel rows are completing their charge collection for the FREX image frame 1806, the ERS imaging camera 1302 can initiate capture of a normal image frame 1816 by initiating exposure of the top pixel row for the normal image frame 1816 at time T8 and then sequentially activating the other pixel rows of the sensor array 1306 until the bottom pixel row is activated at time T10. At time T11 the ERS imaging camera 1302 terminates exposure of the top pixel row and sequentially deactivates the other pixel rows of the sensor array 1306 until exposure of the bottom pixel row is terminated at time T12. After exposure of each pixel row is terminated, the array control logic 1308 reads out the pixel values from that pixel row to obtain the image data for the normal image frame 1816.

As illustrated by the chart 1800, the content of the image frame 1806 includes accumulated charge from the reflection of the modulated light flash 1810, as well as some accumulated charge from ambient light following the termination of the modulated light flash 1810 (as represented by region 1814). This ambient light content can be reduced through filtering or other post-capture processing, or the reflected modulated light-to-ambient light SNR may be sufficiently high for the captured FREX image frame 1806 to allow it to be utilized as a depth frame without further processing. As also illustrated by this example, the modulated light flash 1810 is restrained to a period whereby all pixel rows of the sensor array 1306 are activated for the same image frame (i.e., the FREX image frame 1806). Thus, the modulated light flash 1810 should not interfere with the capture of preceding normal image frame 1802 or the following normal image frame 1816, even though the rolling shutter of the ERS imaging camera 1302 allows the image capture of the FREX image frame 1806 to overlap both of these other image frames.

Figure 19:
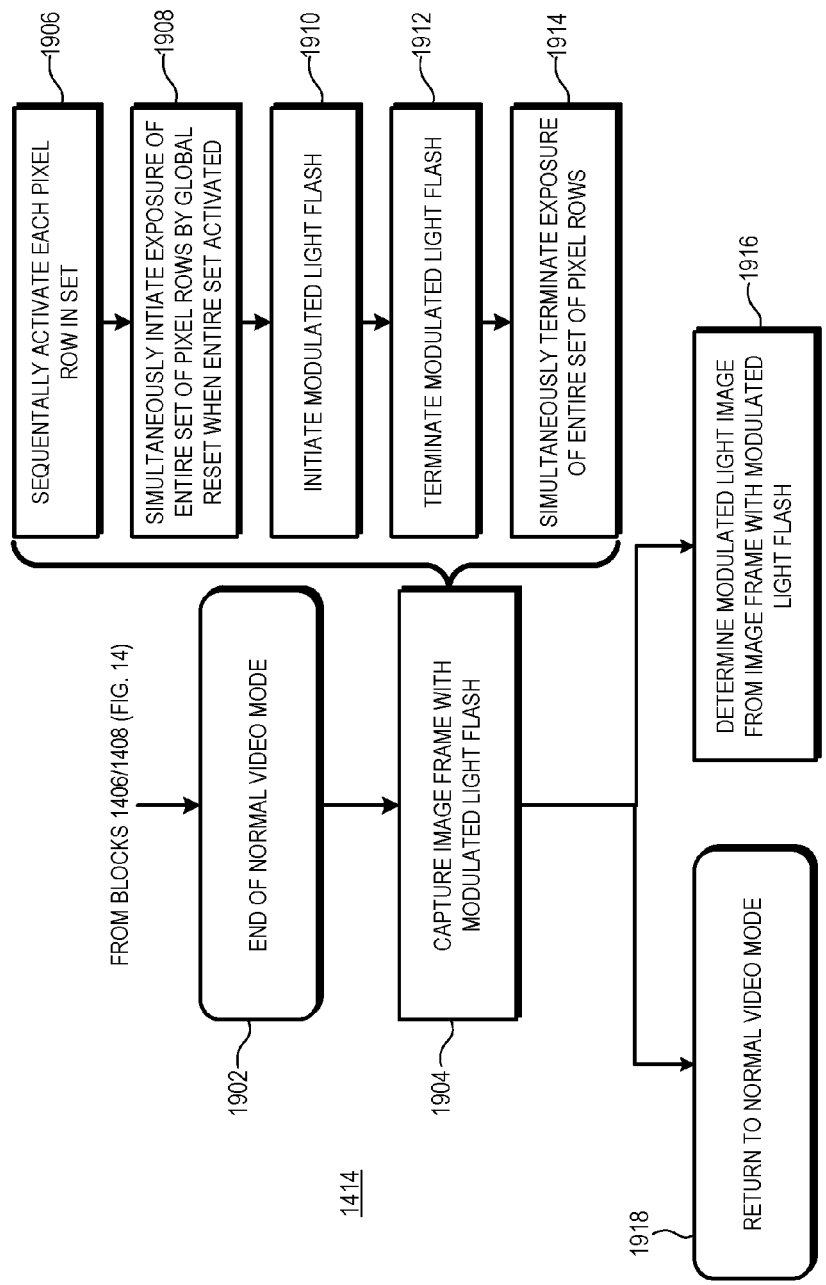
FIG. 19 is a flow diagram illustrating a method for a shuttered FREX flash mode for modulated light flash control in accordance with at least one embodiment of the present disclosure.

FIG. 19 illustrates an example process for implementing the shuttered FREX flash mode of block 1414 of FIG. 14 for depth imagery capture in accordance with at least one embodiment of the present disclosure. For ease of illustration, this process is described in the example context of the image subsystem 1300 of FIG. 13. The depicted process is triggered when a decrementing counter or other mechanism signals the start of an Nth frame at block 1406 (FIG. 14) and the flash mode is identified as the shuttered FREX flash mode at block 1408 (FIG. 14). In response, at block 1902 the sensor controller 1304 switches modes from the normal video mode to the shuttered FREX flash mode.

At block 1904, the sensor controller 1304 controls the ERS imaging camera 1302 and the modulated light projector 119 to project a modulated light flash during the next image frame capture so as to capture a depth image containing the reflection of the modulated light flash. To begin the image capture process, at sub-block 1906 the ERS imaging camera 1302 sequentially activates each pixel row for exposure from the top pixel row to the bottom pixel row. As with the non-shuttered FREX mode described above, before initiating the modulated light flash for the image frame being captured, at sub-block 1908 the sensor controller 1304 asserts the reset signaling 1310, thereby triggering a global reset of all of the pixel rows of the sensor array 1306. This global reset causes the pixel circuitry of each pixel row to clear any accumulated charge and then simultaneously activates every pixel row for exposure. Accordingly, any ambient light information accumulated in the pixel rows before the start of the modulated light flash is cleared from the sensor array 1306.

With the sensor array 1306 thus cleared, at sub-block 1910 the sensor controller 1304 initiates the projection of a modulated light flash by the modulated light projector 119 by asserting the enable signaling 1324, and at sub-block 1912 the sensor controller 1304 terminates the modulated light flash by deasserting the enable signaling 1324 before the top pixel row of the sensor array 1306 is deactivated for read out. In accordance with the rolling shutter operation of the ERS imaging camera 1302, termination of exposure of the pixel rows occurs sequentially from the top pixel row to the bottom pixel row, with the pixel data of each pixel row being read out after its deactivation. However, as with the sequential activation of pixel rows, the sequential deactivation of pixel rows can lead to uneven ambient light charge accumulation after termination of the modulated light flash. Accordingly, at sub-block 1914 the sensor controller 1304 substantially simultaneously terminates charge accumulation across all pixel rows following the termination of the modulated light flash by asserting the shutter signaling 1334, which in turn activates the mechanical shutter 1332. With the mechanical shutter 1332 so activated, light is prevented from impinging upon the sensor array 1306, and thus no further significant charge accumulation occurs at the pixel rows of the sensor array 1306 for the duration of the shutter activation. With the global reset performed at sub-block 1908 at the start of the modulated light flash and the mechanical shutter activation performed at sub-block 1914 at the end of the modulated light flash, there is little opportunity for ambient light to accumulate at the sensor array 1306, and thus the charge accumulation on the pixel rows of the sensor array 1306 is largely a result of reflection of the modulated light flash. As such, the captured image frame is primarily modulated light image data. Moreover, as with the other implementations outlined above, the confinement of the modulated light flash to only that period in which all pixel rows are activated for the same image frame reduces or eliminates modulated light interference in adjacent image frames.

At block 1916, the 2D processor 802 receives the image data for the captured image frame from the ERS imaging camera 1302 and extracts the modulated light image data from the captured image frame and with the depth image data so captured, and at block 1918 the sensor controller 1304 returns to the normal video mode for capturing ambient-light based image frames.

Figure 20:
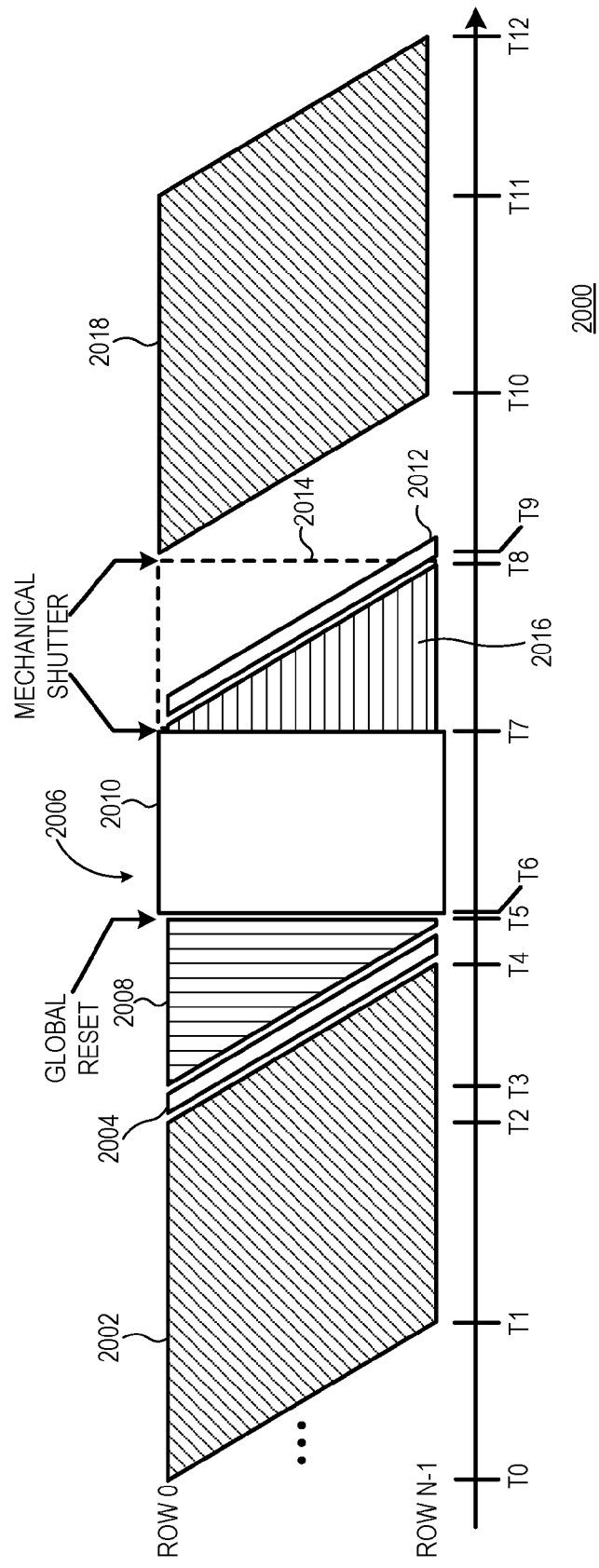
FIG. 20 is a diagram illustrating an example of the shuttered FREX flash mode of FIG. 19 in accordance with at least one embodiment of the present disclosure.

FIG. 20 illustrates an example implementation of the shuttered FREX flash mode of FIG. 19 in accordance with some embodiments. In the depicted chart 2000, the horizontal axis represents time (starting at a time T0) and the horizontal axis represents the pixel rows of the sensor array 1306 (FIG. 13), with the top pixel row being identified as row 0 and the bottom pixel row being identified as row N−1. The diagonally shaded regions represent the periods of activation of the corresponding pixel rows, and the unshaded diagonal bars represent periods of pixel row read out following the exposure of the pixel rows for an image frame.

Initially, the sensor controller 1304 is operating in the normal video mode and thus initiates the capture of a normal image frame 2002 at time T0. In response, the ERS imaging camera 1302 sequentially activates the pixel rows of the sensor array 1306 for exposure from the top pixel row until the bottom pixel row is activated at time T1. The activated pixel rows accumulate charge due to ambient light incident on the sensor array 1306 until time T2, at which point the ERS imaging camera 1302 sequentially deactivates the pixel rows until the bottom pixel row is deactivated at time T4. After exposure of each pixel row is terminated, the array control logic 1308 reads out the pixel values from that pixel row, as illustrated by readout region 2004, to obtain the image data for the normal image frame 2002.

While the bottom pixel rows are completing their charge collection for the normal image frame 2002, the ERS imaging camera 1302 can initiate capture of an image frame 2006, referred to as the "FREX image frame 2006". Accordingly, after read out of the top pixel row ends for the normal image frame 2002, at time T3 the ERS imaging camera 1302 initiates exposure of the top pixel row for the FREX image frame 2006 and then sequentially activates the other pixel rows of the sensor array 1306 until the bottom pixel row is activated at time T5.

As with the non-shuttered FREX mode example of FIG. 18 above, following the activation of all pixel rows at time T5, the sensor controller 1304 asserts the reset signaling 1310 to trigger a global reset of the sensor array 1306, which clears the pixel rows of all of the accumulated charge represented by the vertically striped region 2008 in the chart 2000. Shortly thereafter, at time T6 the sensor controller 1304 initiates a modulated light flash 2010 by asserting the enable signaling 1324 for the modulated light projector 119. The sensor controller 1304 maintains the projection of the modulated light pattern until it is time to terminate exposure of the top pixel row at time T7. As such, the modulated light flash 2010 has a duration extending from time T6 to time T7. The ERS imaging camera 1302 then sequentially deactivates the other pixel rows of the sensor array until exposure is terminated for the bottom pixel row at time T9. After exposure of each pixel row is terminated, the array control logic 1308 reads out the pixel values from that pixel row, as illustrated by readout region 2012, to obtain the image data for the FREX image frame 2006.

However, as any charge accumulated in the pixel rows following termination of the modulated light flash 2010 would be a result of impinging ambient light and thus interfere with the modulated light content intended to be captured in the FREX image frame 2006, the sensor controller 1304 activates the mechanical shutter 1332 for a shutter activation period 2014 that extends from the termination of the modulated light flash 2010 at time T7 to the deactivation of the bottom pixel row at time T8. The activation of the mechanical shutter 1332 thus prevents further accumulation of charge in the pixel rows for the remainder of the image capture period following time T7 (illustrated by vertically shaded region 2016). With the global reset performed at the initiation of the modulated light flash 2010 at time T5 and the mechanical shutter activation performed at the termination of the modulated light flash 2010 time T7, the pixel rows are effectively prevented from substantial accumulation of charge due to ambient light, and thus the resulting image data read out from the pixel rows for the FREX image frame 2006 is primarily composed of reflected modulated light content, and therefore is well suited for depth processing without requiring additional pre-processing to remove ambient light content.

With the shuttered FREX flash completed, the sensor controller 1304 returns to the normal video mode to capture a next normal image frame 2018. However, because the mechanical shutter 1332 is activated until time T8 (and thus no ambient light will be incident on the sensor array 1306 until time T8), the ERS imaging camera 1302 may delay initiation capture of a normal image frame 2018 by initiating exposure of the top pixel row for the normal image frame 2018 at time T9 following the end of the activation of the mechanical shutter 1332 and then sequentially activating the other pixel rows of the sensor array 1306 until the bottom pixel row is activated at time T10. At time T11 the ERS imaging camera 1302 terminates exposure of the top pixel row and sequentially deactivates the other pixel rows of the sensor array 1306 until exposure of the bottom pixel row is terminated at time T12. After exposure of each pixel row is terminated, the array control logic 1308 reads out the pixel values from that pixel row to obtain the image data for the normal image frame 2018. Alternatively, the ERS imaging camera 1302 can proceed with sequential activation of the pixel rows for exposure following the readout of each pixel row, and then process the resulting captured image data to account for the interference caused by the period in which the mechanical shutter 1332 was activated while the pixel rows were also activated.

Much of the inventive functionality and many of the inventive principles described above are well suited for implementation with or in software programs or instructions and integrated circuits (ICs) such as application specific ICs (ASICs). It is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation. Therefore, in the interest of brevity and minimization of any risk of obscuring the principles and concepts according to the present disclosure, further discussion of such software and ICs, if any, will be limited to the essentials with respect to the principles and concepts within the preferred embodiments.

In this document, relational terms such as first and second, and the like, may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element. The term "another", as used herein, is defined as at least a second or more. The terms "including" and/or "having", as used herein, are defined as comprising. The term "coupled", as used herein with reference to electro-optical technology, is defined as connected, although not necessarily directly, and not necessarily mechanically. The term "program", as used herein, is defined as a sequence of instructions designed for execution on a computer system. A "program", or "computer program", may include a subroutine, a function, a procedure, an object method, an object implementation, an executable application, an applet, a servlet, a source code, an object code, a shared library/dynamic load library and/or other sequence of instructions designed for execution on a computer system.

The specification and drawings should be considered as examples only, and the scope of the disclosure is accordingly intended to be limited only by the following claims and equivalents thereof. Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. The steps of the flowcharts depicted above can be in any order unless specified otherwise, and steps may be eliminated, repeated, and/or added, depending on the implementation. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A user-held electronic device comprising:
a modulated light projector;
an electronic rolling shutter (ERS) imaging camera having a sensor array with pixel rows;
a controller to control the modulated light projector to project a modulated light flash into an environment of the user-held electronic device during capture of a first image frame by the sensor array and to refrain from projecting any modulated light flash during capture of a second image frame adjacent to the capture of the first image frame, and wherein the controller is to initiate the modulated light flash while each pixel row of the sensor array is exposed for gathering light for the first image frame and to terminate the modulated light flash before any pixel row of the sensor array ceases to be exposed for gathering light for the first image frame; and
a processor to determine modulated light image data based on the first image frame, to determine one or more two-dimensional (2D) spatial features of the environment based on visible light imagery and match the 2D spatial features with a corresponding depth reading based on a 2D feature analysis of the modulated light image data, to identify one or more three-dimensional (3D) spatial features from the 2D spatial features, and to determine a pose of the user-held electronic device relative to the environment based on the one or more 3D spatial features; and
wherein the controller is to control the ERS imaging camera to selectively:

initiate exposure of each of the pixel rows of the sensor array substantially simultaneously for capture of the first image frame and to initiate the modulated light flash in response to the initiation of the exposure of the pixel rows substantially simultaneously; or capture the first and second image frames at a frame rate greater than a nominal frame rate for capture of visible light imagery by the user-held electronic device.

2. The user-held electronic device of claim 1, wherein: the ERS imaging camera captures the first image frame and the second image frame at a frame rate at least twice a nominal frame rate of the ERS imaging camera.

3. The user-held electronic device of claim 1, wherein: the processor is to determine the modulated light image data based on a comparison of the first image frame and the second image frame.

4. The user-held electronic device of claim 1, further comprising:

a mechanical shutter to terminate exposure of all of the pixel rows of the sensor array substantially simultaneously for capture of the first image frame; and wherein the controller is to control the modulated light projector to terminate the modulated light flash prior to activation of the mechanical shutter for capture of the first image frame.

5. The user-held electronic device of claim 1, wherein the modulated light projector comprises:

an array of one or more vertical cavity surface emitting laser (VCSEL) diodes;

an array of one or more lenses overlying the array of one or more VCSEL diodes; and a diffractive optical element overlying the array of one or more lenses.

6. A method comprising:

capturing a first image frame at an electronic rolling shutter (ERS) imaging camera of a user-held electronic device;

initiating a projection of a modulated light flash into an environment of the user-held electronic device while each pixel row of a sensor array of the ERS imaging camera is exposed for gathering light for the first image frame;

terminating the modulated light flash before any pixel row of the sensor array ceases to be exposed for gathering light for the first image frame;

capturing a second image frame at the ERS imaging camera adjacent to capturing the first image frame;

refraining from projection of any modulated light flash during capture of the second image frame;

determining modulated light image data based on the first image frame;

determining one or more two-dimensional (2D) spatial features of the environment based on visible light imagery and matching the 2D spatial features with a corresponding depth reading based on a 2D feature analysis of the modulated light image data;

identifying three-dimensional (3D) spatial features from the 2D spatial features;

determining a pose of the user-held electronic device relative to the environment based on the 3D spatial features;

wherein capturing the first image frame includes selectively:

initiating exposure of all of the pixel rows of the sensor array substantially simultaneously; and wherein initiating the modulated light flash includes initiating the modulated light flash in response to the initiation of the exposure of all of the pixel rows substantially simultaneously; or capturing the first and second image frames at a frame rate greater than a nominal frame rate for capture of visible light imagery by the user-held electronic device.

7. The method of claim 6, wherein determining the modulated light image data based on the first image frame comprises:

determining the modulated light image data based on a comparison of the first image frame and the second image frame.

8. The method of claim 6, wherein:

capturing the first image frame further includes terminating exposure of the pixel rows of the sensor array substantially simultaneously; and terminating the modulated light flash includes terminating the modulated light flash prior to terminating exposure of the pixel rows substantially simultaneously.

9. The method of claim 8, wherein terminating exposure of the pixel rows substantially simultaneously comprises:

activating a mechanical shutter to terminate exposure of the pixel rows.

10. A method comprising:

capturing, at an electronic rolling shutter (ERS) imaging camera of a user-held electronic device, a set of image frames;

capturing, at the ERS imaging camera, a first image frame and a second image frame;

projecting a modulated light flash into an environment of the user-held electronic device during the capture of the first image frame, a duration of the modulated light flash occurring while each pixel row of the ERS imaging camera is exposed for gathering light for the first image frame and terminating before any pixel row of the ERS imaging camera ceases to be exposed for gathering light for the first image frame;

refraining from projection of a modulated light flash during the capture of the second image frame;

determining modulated light image data based on a comparison of the first image frame and the second image frame;

determining one or more two-dimensional (2D) spatial features of the environment based on visible light imagery and matching the 2D spatial features with a corresponding depth reading based on a 2D feature analysis of the modulated light image data;

identifying three-dimensional (3D) spatial features from the 2D spatial features; and determining a pose of the user-held electronic device relative to the environment based on the one or more 3D spatial features;

wherein capturing the first image frame includes initiating exposure of all of pixel rows of a sensor array of the ERS imaging camera substantially simultaneously; and wherein projecting the modulated light flash includes initiating the modulated light flash in response to the initiation of the exposure of all of the pixel rows substantially simultaneously.

11. The method of claim 10, wherein:

capturing the first image frame further includes terminating exposure of the pixel rows of the sensor array substantially simultaneously; and terminating the modulated light flash includes terminating the modulated light flash prior to terminating exposure of the pixel rows substantially simultaneously.

12. The method of claim 11, wherein terminating exposure of the pixel rows substantially simultaneously comprises:
activating a mechanical shutter to terminate exposure of the pixel rows.

13. The method of claim 10, wherein determining the modulated light image data comprises:
subtracting image content of the second image frame from image content of the first image frame.

14. The method of claim 10, further comprising:
displaying image content of the image frames of the set of image frames; and
refraining from displaying image content of the first image frame and the second image frame.

15. The method of claim 10, wherein capturing the first image frame and the second image frame comprises:
capturing the second image frame prior to capturing the first image frame.

\* \* \* \* \*